(12) United States Patent
Tepo et al.

(10) Patent No.: US 10,670,206 B2
(45) Date of Patent: Jun. 2, 2020

(54) QUIET-CEILING LIGHT FIXTURE SYSTEMS AND METHODS

(71) Applicant: ABL IP Holding LLC, Atlanta, GA (US)

(72) Inventors: Megan Marie Tepo, Lakewood, CO (US); Douglas Dewayne Grove, Grayson, GA (US); John M. Reilly, Atlanta, GA (US); Joseph James Onda, Lawrenceville, GA (US); James Scott Conn, Conyers, GA (US); Jeff Robert Shaner, Loganville, GA (US)

(73) Assignee: ABL IP Holding LLC, Atlanta, GA (US)

( * ) Notice: Subject to any disclaimer, the term of this patent is extended or adjusted under 35 U.S.C. 154(b) by 0 days.

(21) Appl. No.: 15/958,399

(22) Filed: Apr. 20, 2018

(65) Prior Publication Data

US 2018/0320843 A1 Nov. 8, 2018

Related U.S. Application Data

(60) Provisional application No. 62/500,389, filed on May 2, 2017.

(51) Int. Cl.
*F21S 8/02* (2006.01)
*F21S 8/04* (2006.01)
(Continued)

(52) U.S. Cl.
CPC ............... *F21S 8/04* (2013.01); *F21K 9/20* (2016.08); *F21S 8/026* (2013.01); *F21V 5/046* (2013.01);
(Continued)

(58) Field of Classification Search
CPC . F21K 9/20; F21K 9/68; F21V 17/162; F21V 21/088; F21V 21/14
See application file for complete search history.

(56) References Cited

U.S. PATENT DOCUMENTS

| | | |
|---|---|---|
| 3,182,187 A | 5/1965 | Gellert |
| 3,381,123 A | 4/1968 | Docimo |
| (Continued) | | |

OTHER PUBLICATIONS

U.S. Appl. No. 15/958,407, "Non-Final Office Action," dated Feb. 8, 2019, 14 pages.

(Continued)

*Primary Examiner* — Evan P Dzierzynski
*Assistant Examiner* — Keith G. Delahoussaye
(74) *Attorney, Agent, or Firm* — Kilpatrick Townsend & Stockton LLP

(57) ABSTRACT

A light fixture includes a housing having sidewalls that define a manifold aperture, extending from upper to lower edges of the manifold aperture. The housing includes first coupling features. The light fixture includes at least one adapter plate with second coupling features that removably couple with the first coupling features. The adapter plate defines an adapter plate aperture. At least one light emitting engine removably couples with the adapter plate such that emitted light passes through the adapter plate aperture. The light fixture further includes a baffle that includes at least one baffle cell. The baffle cell includes an upper baffle edge that defines: an upper baffle aperture through which light emitted by the light engine passes, a lower baffle edge that defines an output aperture for the emitted light, and a baffle cell wall that extends from the upper baffle edge to the lower baffle edge.

18 Claims, 16 Drawing Sheets

(51) Int. Cl.

| | |
|---|---|
| *F21V 15/01* | (2006.01) |
| *F21V 21/088* | (2006.01) |
| *F21V 29/503* | (2015.01) |
| *F21V 21/14* | (2006.01) |
| *F21V 23/02* | (2006.01) |
| *H01L 25/075* | (2006.01) |
| *H01L 33/58* | (2010.01) |
| *F21V 5/04* | (2006.01) |
| *F21V 21/04* | (2006.01) |
| *F21V 17/16* | (2006.01) |
| *F21K 9/20* | (2016.01) |
| *F21V 21/005* | (2006.01) |
| *F21V 7/28* | (2018.01) |
| *F21Y 115/10* | (2016.01) |
| *F21V 29/76* | (2015.01) |
| *F21V 5/00* | (2018.01) |
| *F21V 7/04* | (2006.01) |
| *F21K 9/68* | (2016.01) |

(52) U.S. Cl.
CPC ............ *F21V 15/01* (2013.01); *F21V 17/162* (2013.01); *F21V 21/005* (2013.01); *F21V 21/044* (2013.01); *F21V 21/088* (2013.01); *F21V 21/14* (2013.01); *F21V 23/02* (2013.01); *F21V 29/503* (2015.01); *H01L 25/0753* (2013.01); *H01L 33/58* (2013.01); *F21K 9/68* (2016.08); *F21V 5/007* (2013.01); *F21V 7/043* (2013.01); *F21V 7/28* (2018.02); *F21V 29/763* (2015.01); *F21Y 2115/10* (2016.08)

(56) References Cited

U.S. PATENT DOCUMENTS

| | | | |
|---|---|---|---|
| 4,729,075 A * | 3/1988 | Brass | ............ F21S 8/02 362/217.03 |
| 5,452,193 A | 9/1995 | Hinnefeld et al. | |
| 5,548,499 A | 8/1996 | Zadeh | |
| D386,802 S | 11/1997 | Kim | |
| D427,368 S | 6/2000 | Kelmelis et al. | |
| 6,779,908 B1 | 8/2004 | Ng | |
| 7,431,482 B1 * | 10/2008 | Morgan | ............ F21S 2/005 362/364 |
| D589,207 S | 3/2009 | Fujiwara et al. | |
| D599,951 S | 9/2009 | Pickard et al. | |
| D601,295 S | 9/2009 | Brown | |
| D653,799 S | 2/2012 | Baker et al. | |
| 8,215,805 B2 * | 7/2012 | Cogliano | ............ F21S 8/02 362/364 |
| D789,597 S | 6/2017 | Wallach | |

OTHER PUBLICATIONS

Canadian Application No. CA 2965932, "Office Action," dated Apr. 15, 2019, 3 Pages.

\* cited by examiner

FIG. 1
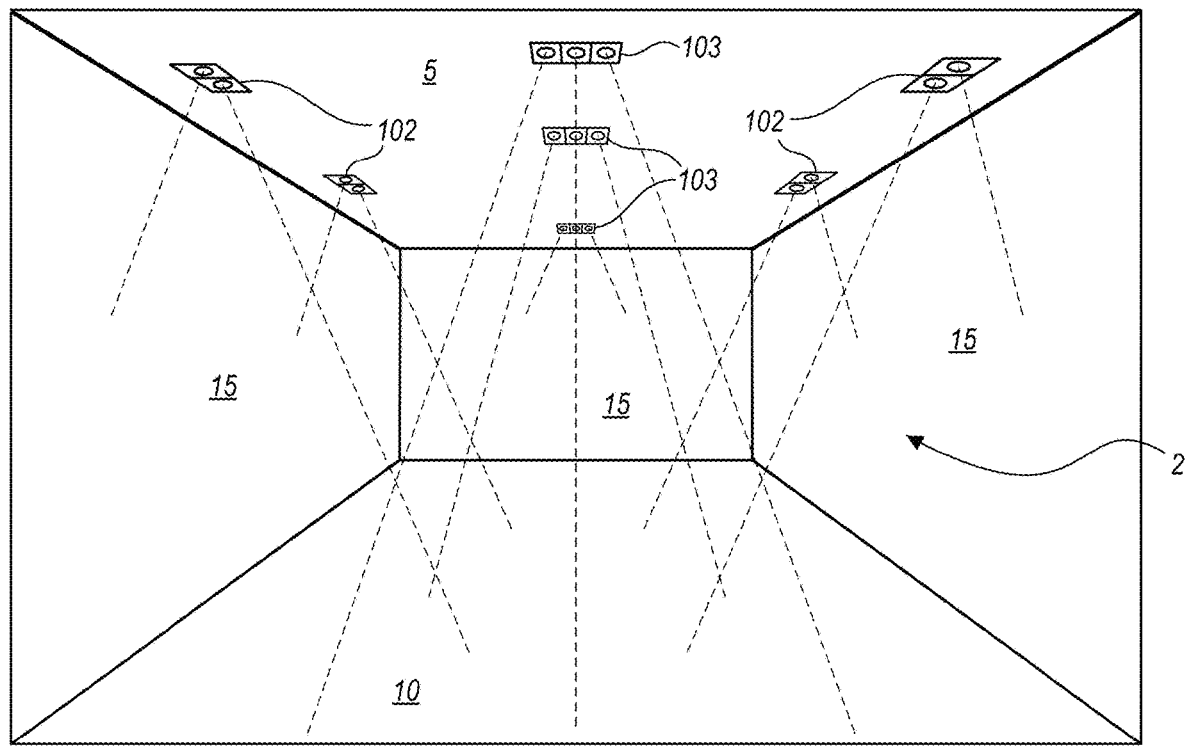
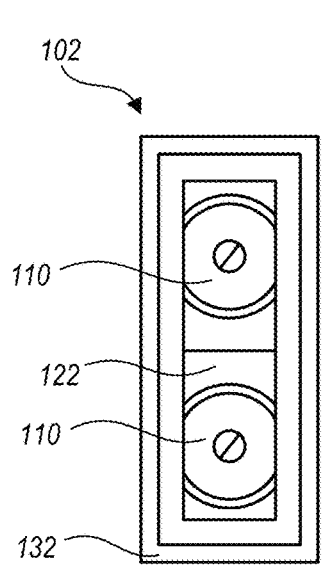
FIG. 2A
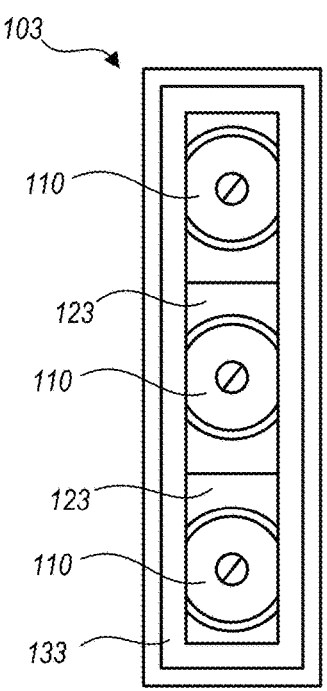
FIG. 2B

QUIET-CEILING LIGHT FIXTURE SYSTEMS AND METHODS

CROSS-REFERENCE TO RELATED APPLICATION

This non-provisional application claims the benefit of U.S. Provisional Application Ser. No. 62/500,389, filed May 2, 2017 and titled "Quiet-Ceiling Light Fixture Systems and Methods," the contents of which are incorporated herein by reference.

BACKGROUND

Luminaires for interior lighting are often designed for aesthetic appeal when directly viewed, as well as for providing high quality illumination. Related design objectives can include providing visually interesting components such as a housing and/or other structural components or light scattering or diffusing type elements. Typically, the actual light-emitting devices within luminaires are more or less exempt from such design objectives, because viewers generally will not be looking directly into the light-emitting devices due to discomfort. However, other elements within fixtures can provide visual interest as well as shielding viewers from high-angle light output (glare). Certain other features often present in luminaires, but which may be regarded as distracting, include optical surfaces that form angles. Optical performance typically changes noticeably across such angles such that a viewer's eye is drawn to them, instead of the luminaire simply providing gradually or continuously changing luminous intensity across the visible area of the luminaire.

SUMMARY

Quiet-ceiling light fixture systems and methods herein recognize the advantages of providing a visually "quiet" ceiling, that is, harsh light may be limited to low angles so that distant light fixtures do not present glare, while for human viewers directly underneath the light fixtures, eyebrows block glare of the direct beam. The light fixtures herein also recognize the advantages of providing fully adjustable and field reconfigurable lighting modules in small housings.

In an embodiment, a light fixture includes a manifold housing having sidewalls that define a manifold aperture. The sidewalls extend from one or more upper edges of the manifold aperture to a lower edge of the manifold aperture. A first dimension of the manifold aperture defines an axial direction, and a second dimension of the manifold aperture defines a lateral direction. The manifold includes one or more first coupling features. The light fixture also includes at least one adapter plate including one or more second coupling features. At least one of the second coupling features of the adapter plate removably couple with the one or more first coupling features of the manifold housing, to secure the at least one adapter plate to the manifold housing. The adapter plate defines an adapter plate aperture. At least one light engine emits light and removably couples with the at least one adapter plate such that light emitted by the at least one light engine passes through the adapter plate aperture and the manifold aperture toward a light-emitting side of the light fixture. The light fixture further includes a baffle that substantially spans the manifold aperture and comprises at least one baffle cell. The baffle cell includes (i) an upper baffle edge that defines an upper baffle aperture through which light emitted by the at least one light engine passes, (ii) a lower baffle edge that defines an output aperture for the emitted light, and (iii) a baffle cell wall that extends from the upper baffle edge to the lower baffle edge.

In an embodiment, a light fixture includes a manifold housing, adapter plates, light engines corresponding in number to the adapter plates, a baffle and a power supply. The manifold housing includes one or more first coupling features. One or more second coupling features of each of the adapter plates removably couple with corresponding ones of the first coupling features, to secure each of the adapter plates to the manifold housing. Each light engine is removably coupled to a corresponding one of the adapter plates. Each of the light engines includes a light source within a light source housing, and each of the light sources emits light toward a primary optic that is secured to the light source housing with a retainer ring. The baffle substantially spans the manifold aperture and forms one baffle cell for each of the plurality of light engines. Each of the baffle cells includes a baffle cell wall that defines an upper baffle aperture through which light is received from the primary optic, and defines an output aperture through which light is emitted. The baffle cell wall also forms a compound azimuthal and vertical profile between the upper baffle aperture and the output aperture. The power supply includes a plurality of power supply modules. Each one of the light engines receives electrical power from a corresponding one of the power supply modules.

In an embodiment, a baffle for use in a light fixture that includes one or more light emitter positions includes one or more upper edges, each of the upper edges encircling a light emitting aperture for one of the light emitter positions. Each point of the upper edges lies within an upper region, and plan view shapes of the upper edges form closed shapes that are devoid of angles. The baffle also includes one or more lower edges corresponding in number with the one or more upper edges. Each of the one or more lower edges encircles an output aperture for the corresponding light emitter position. Each point of the one or more lower edges lies within a lower region, and plan view shapes of the lower edges form closed shapes that are devoid of angles. The baffle further includes an interior baffle surface that extends downwardly from each of the upper edges to corresponding ones of the lower edges. The interior baffle surface is continuously and downwardly concave from each of the upper edges to each of the lower edges, and is devoid of angles.

In an embodiment, a retainer ring for a light fixture includes a cylindrical main body section that defines a cylindrical axis, and an inner retaining flange that extends radially inward from a distal end of the main body section. The inner retaining flange extends substantially about a circumference of the distal end. One or more coupling features extend radially inward from the retainer ring.

In an embodiment, a customization kit for a light engine that defines an optical axis includes a retainer ring configured to couple with the light engine, and two or more primary optics that are mechanically compatible with the light engine, and retainable to the light engine with the retainer ring. When the retainer ring couples with the light engine, a cylindrical axis of the retainer ring coincides with the optical axis.

In an embodiment, a method of field reconfiguring a light fixture includes coupling an optical component with a light engine of the light fixture, by engaging one or more coupling features of a retainer ring, with corresponding coupling features of a light source housing of the light engine. The retainer ring includes a cylindrical main body section that defines a cylindrical axis, an inner retaining flange that extends radially inward from a distal end of the main body section, the inner retaining flange extending substantially about a circumference of the distal end, and the one or more coupling features, extending radially inward from the retainer ring. The cylindrical axis of the retainer ring is coincident with an optical axis of the light source housing, when the one or more coupling features engage with the light source housing.

In an embodiment, a method of field reconfiguring a light fixture that is mounted within an aperture of a surface includes disengaging from the surface at least one spring clip that retains a housing of the light fixture within the aperture, and removing the housing from the aperture. The method also includes decoupling a first light engine from the housing, electrically decoupling the first light engine from a power supply, and electrically coupling a second light engine with the power supply. The method further includes coupling the second light engine with the housing, replacing the housing into the aperture, and re-engaging the spring clip with the surface to retain the housing within the aperture.

In an embodiment, a method of generating a surface profile for a light fixture baffle, the method includes defining an upper edge for the baffle and defining a lower edge for the baffle. A plan view shape of the upper edge is a first closed shape that lies within a first region and is devoid of angles. The closed shape defines a centroid. A plan view shape of the lower edge is a second closed shape that is devoid of angles, and lies within a second region. The method also includes defining a first side profile that is devoid of angles, and connects the upper edge with the lower edge at a first azimuthal angle about the centroid. The method further includes defining a second side profile that that is devoid of angles, and connects the upper edge with the lower edge at a second azimuthal angle offset from the first azimuthal angle. The method further includes interpolating side profiles from the first side profile to the second side profile, along all azimuthal angles between the first azimuthal angle and the second azimuthal angle, so as to form the baffle surface profile. The baffle surface profile transitions smoothly from the first side profile at the first azimuthal angle to the second side profile at the second azimuthal angle.

BRIEF DESCRIPTION OF THE DRAWINGS

Embodiments are described in detail below with reference to the following figures, in which like numerals within the drawings and mentioned herein represent substantially identical structural elements.

FIG. 1 is a schematic perspective view of an interior space illuminated by a set of quiet-ceiling light fixtures, according to one or more embodiments.

FIG. 2A is a bottom plan schematic view illustrating a quiet-ceiling light fixture having two light engines, according to an embodiment.

FIG. 2B is a bottom plan schematic view illustrating a quiet-ceiling light fixture having three light engines, according to an embodiment.

DETAILED DESCRIPTION

Figure 3A:
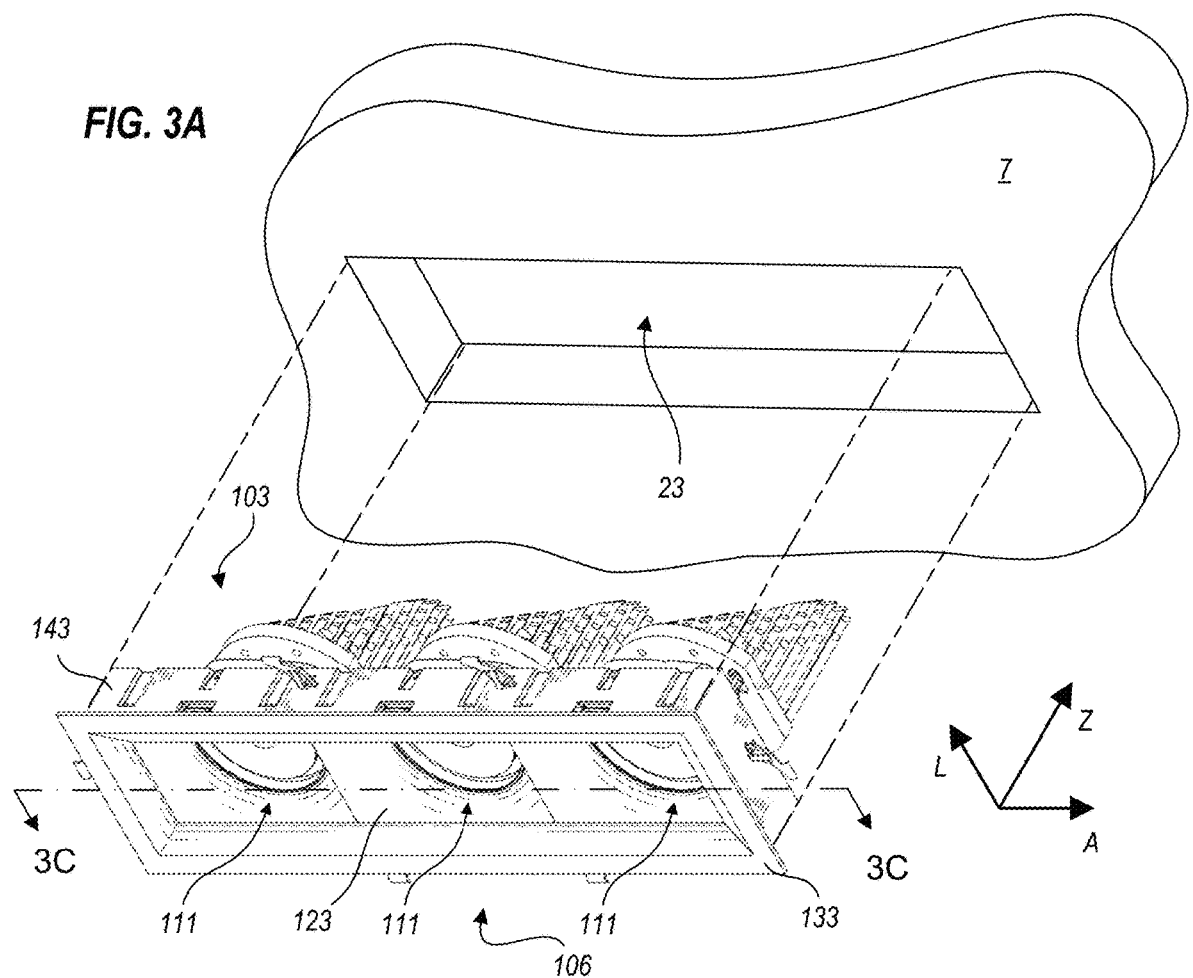
FIG. 3A is a schematic, upward looking, exploded isometric view of the quiet-ceiling light fixture of FIG. 2B, illustrating a mounting surface with an aperture into which the light fixture may be installed, according to an embodiment.

The subject matter of embodiments of the present invention is described here with specificity to meet statutory requirements, but this description is not intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described. Each example is provided by way of illustration and/or explanation, and not as a limitation. For instance, features illustrated or described as part of one embodiment may be used on another embodiment to yield a further embodiment. Upon reading and comprehending the present disclosure, one of ordinary skill in the art will readily conceive many equivalents, extensions, and alternatives to the specific, disclosed luminaire types, all of which are within the scope of embodiments herein.

Quiet-ceiling light fixture systems and methods are disclosed according to various embodiments. Certain embodiments provide light fixtures that are compact and provide a visually "quiet" ceiling, that is, direct views of light engines therein are obscured at high angles (for example, but not limited to, angles over about 55 degrees from nadir, when ceiling mounted), such that the light sources provide targeted illumination only toward low angles (for example, but not limited to, angles less than about 55 degrees from nadir, when ceiling mounted). Between nadir and 55 degrees is sometimes considered a useful range for light because directly under a light fixture, the human eyebrow acts as a natural glare shield, but when viewed from a distance, light over 55 degrees from nadir is not shielded and becomes unwanted glare.

Individual fixtures herein provide one or more individual light sources that may be fixed or adjustable, that is, the light source may be tilted in polar angle, and/or rotated in azimuthal angle, according to needs at a given location. The light sources are field-reconfigurable using methods discussed herein. Certain embodiments feature hardware that enables re-configurability by providing a retainer ring that may be disassembled from below the fixture to add, remove and/or replace components, such as optical accessories. The retainer ring itself may be formed so as to include optical features (for example, certain of the optical features may be integrally molded with the retainer ring). Certain of these embodiments, and others, can also be customized through the use of interchangeable adapter plates, each of which provides mechanical support for a specific type of light engine and/or other lighting related hardware, such as sensors, communication devices and the like.

Lighting designers often desire a minimalistic form factor but do not want to compromise the "layers" of light (e.g., different brightnesses, colors or color temperatures, light directionality and spread, visual appearance of the fixture itself, and the like) necessary to reach design goals for a given space. The design flexibility facilitated by the re-configurable and interchangeable components discussed herein provide lighting designers with the ability to provide multiple layers of light from a single type of fixture housing. This, in turn, allows previously unachievable organization and minimalistic lighting in architectural environments. The light fixtures herein may be used advantageously in many architectural applications such as, but not limited to, corporate offices, lobbies, conference centers, conference rooms, performance or sporting venues, hotels, medical offices or facilities, retail establishments, and/or standalone or multi-unit residences. Embodiments of these fixtures are flexible in that any given light engine position within a housing can be field-configured or -reconfigured as a fixed downlight, adjustable, wallwash, or pendant style.

In the following description, positional terms like "above," "below," "vertical," "horizontal" and the like are sometimes used to aid in understanding features shown in the drawings as presented, that is, in the orientation in which labels of the drawings read normally. These meanings are adhered to, notwithstanding that light fixtures herein may be mounted to surfaces that are not horizontal.

FIG. 1 is a schematic perspective view illustrating an interior space 2 illuminated by quiet-ceiling light fixtures 102 and 103, according to embodiments. FIGS. 2A and 2B are bottom plan schematic views illustrating light fixtures 102 and 103, respectively. In FIG. 1, a ceiling 5 is used as a mounting surface for light fixtures 102, 103, but this is not required; light fixtures herein may mount with other surfaces such as walls 15, floor 10 or any other available surface.

As shown in FIGS. 2A and 2B, light fixtures 102 include two light engines 110, while light fixtures 103 include three light engines 110. Each light fixture 102 includes a baffle 122 and a trim piece 132, while light fixture 103 includes a baffle 123 and a trim piece 133.

Referring back to FIG. 1, light engines 110 are shown within light fixtures 102 and 103, but are not labeled for clarity of the drawing. However, a broken line extends from a center of light emission for each light engine 110, illustrating a center beam path of light from the corresponding light engine 110. Broken lines for different ones of light engines 110 are shown extending in different directions, illustrating the adjustability of light engines 110 within each light fixture 102, 103. As described further below, light engines 110 may be fixed or may be adjustable in polar and/or azimuthal angle, either before or after installation. Width of the light beams can be also adjusted before or after installation by replacing optics of light engines 110 and/or adding or deleting accessories to light engines 110. In FIG. 1, it can be seen that if the broken lines shown indicate centers of light beams having half-angles of about 55 degrees, all of floor 10 shown in FIG. 1 will be reasonably well illuminated, as will portions of walls 15.

Light fixtures herein may include adapter plates that couple with housings disposed therein to provide structural support for light engines 110 and/or other lighting related devices. Adapter plates and baffles may couple with one another through complementary attachment points so that the adapter plates can be exchanged as necessary, before or after installation, to support a desired light engine 110. In some embodiments, adapter plates provide apertures for corresponding light engines 110 to emit light through, while in other embodiments, an adapter plate provides mechanical support for a light engine 110 that is situated partially or completely below the adapter plate. In some of these and in other embodiments, adapter plates provide mechanical support for other lighting related devices, and do not necessarily form apertures. In still other embodiments, adapter plates simply close off an associated light engine position in which no light engine 110 or other lighting related device is to be installed. A universal adapter plate may be provided that can support a variety of different types of light engines. In other embodiments, however, adapter plates are designed to couple with a particular light engine.

Light engines 110 herein may be fixed or adjustable. When adjustable, light engines 110 may be mechanically adjustable in tilt and/or azimuthal angle. Adjustable light engines 110 may also include mechanisms for shaping (e.g., collimating, focusing, defocusing and the like) light produced therein. Both fixed and adjustable light engines 110 may include optics that may be removable and replaceable with different optics that have compatible form factors, but provide different light shaping. Both fixed and adjustable light engines 110 may also include features to allow coupling and/or removal of accessories such as collimating shields, glare shields, diffusers, kicker reflectors and others. Light engines 110 may either connect to standard electrical power (e.g., 110/120 VAC) that is controlled externally, or connect with a power supply that in turn provides power that is customized by type (e.g., low voltage DC) and is controlled to regulate light supplied by the light engines. Light engines 110 advantageously generate light using light-emitting diodes (LEDs) in order to provide high light output and low heat generation in a small physical size that can cooperate with compact optics. For example, light fixture 102 may have a housing as small as 2¾ inches wide (lateral dimension) by 7¼ inches long (axial dimension), excluding a trim piece that is installed to mask a gap between the housing and aperture cut into a ceiling to accommodate it. Light fixture 103 may have a housing as small as 2¾ inches wide by 10¾ inches long, excluding a trim piece. Each of light fixtures 201 and 103 may have light engines 110-1 spaced at 3½ inches, center to center. In embodiments, this spacing is sufficient to allow any combination of tilt (e.g., polar angle adjustment) up to 40 degrees from vertical, and swivel (e.g., azimuthal angle adjustment) at any angle within a 360 degree range, of light engines 110-1, without adjacent light engines 110-1 interfering with one another. Trim piece 133 may have outer dimensions of 3¼ inches wide (lateral direction) by 11¼ inches long (axial dimension). Exemplary embodiments of housings, baffles, attachment points, light engines and other features of quiet-ceiling light fixtures are now discussed.

Figure 3B:
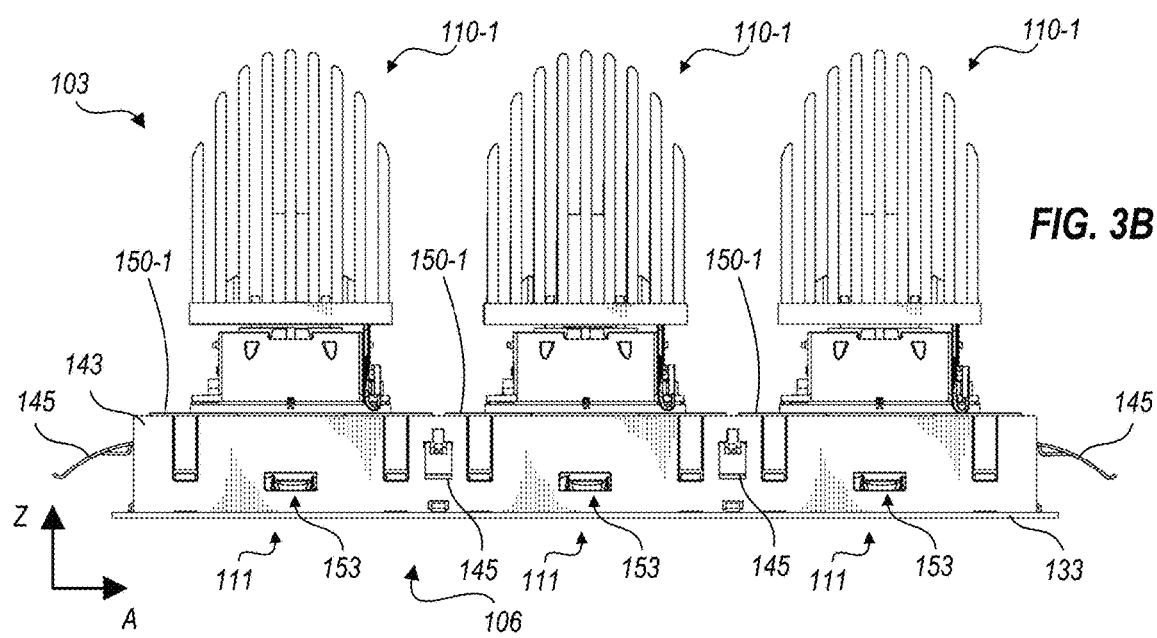
FIG. 3B is a schematic side elevation of the quiet-ceiling light fixture of FIG. 2B.
Figure 3C:
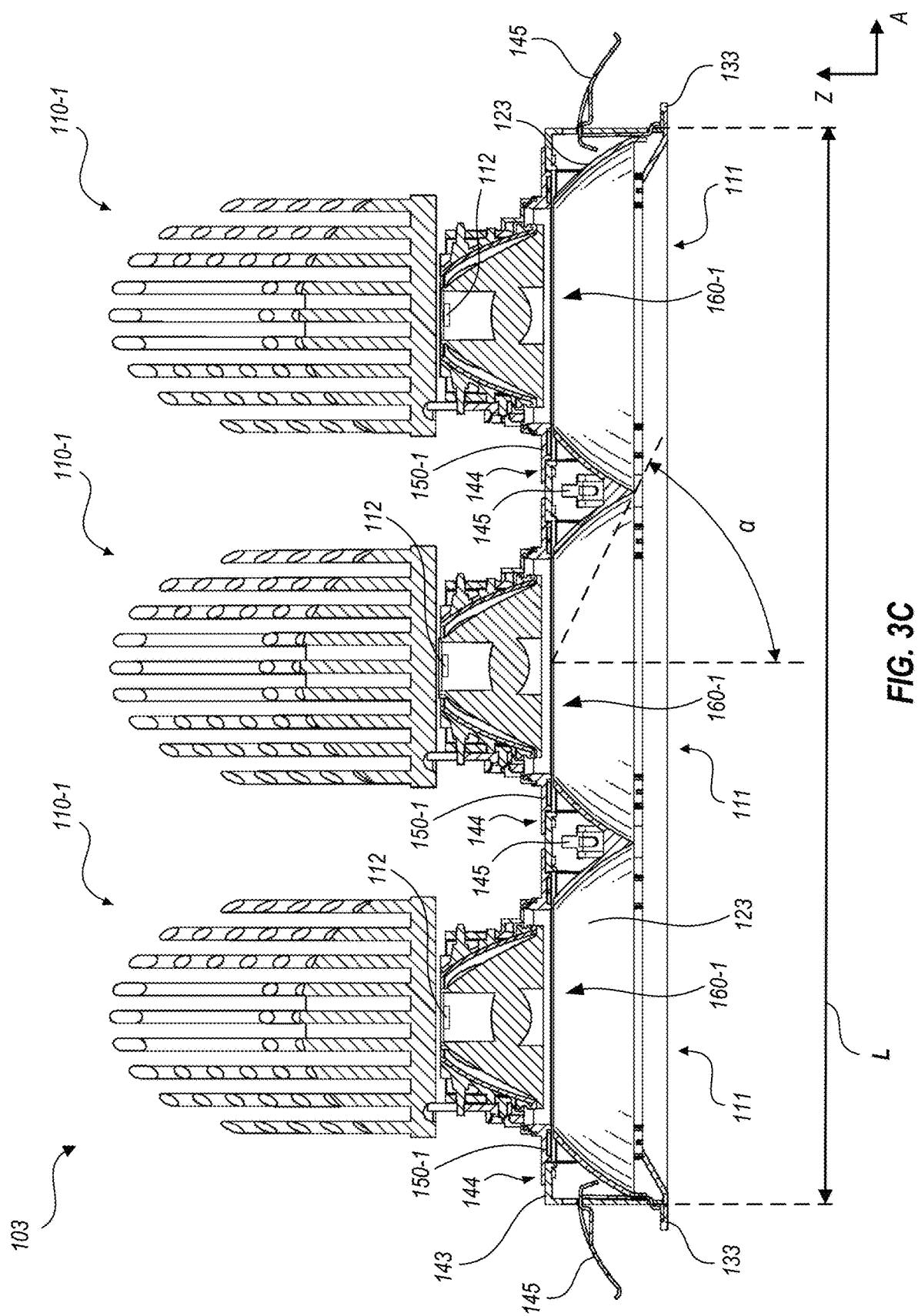
FIG. 3C is a schematic cross-sectional drawing of the quiet-ceiling light fixture of FIG. 2B.
Figure 3D:
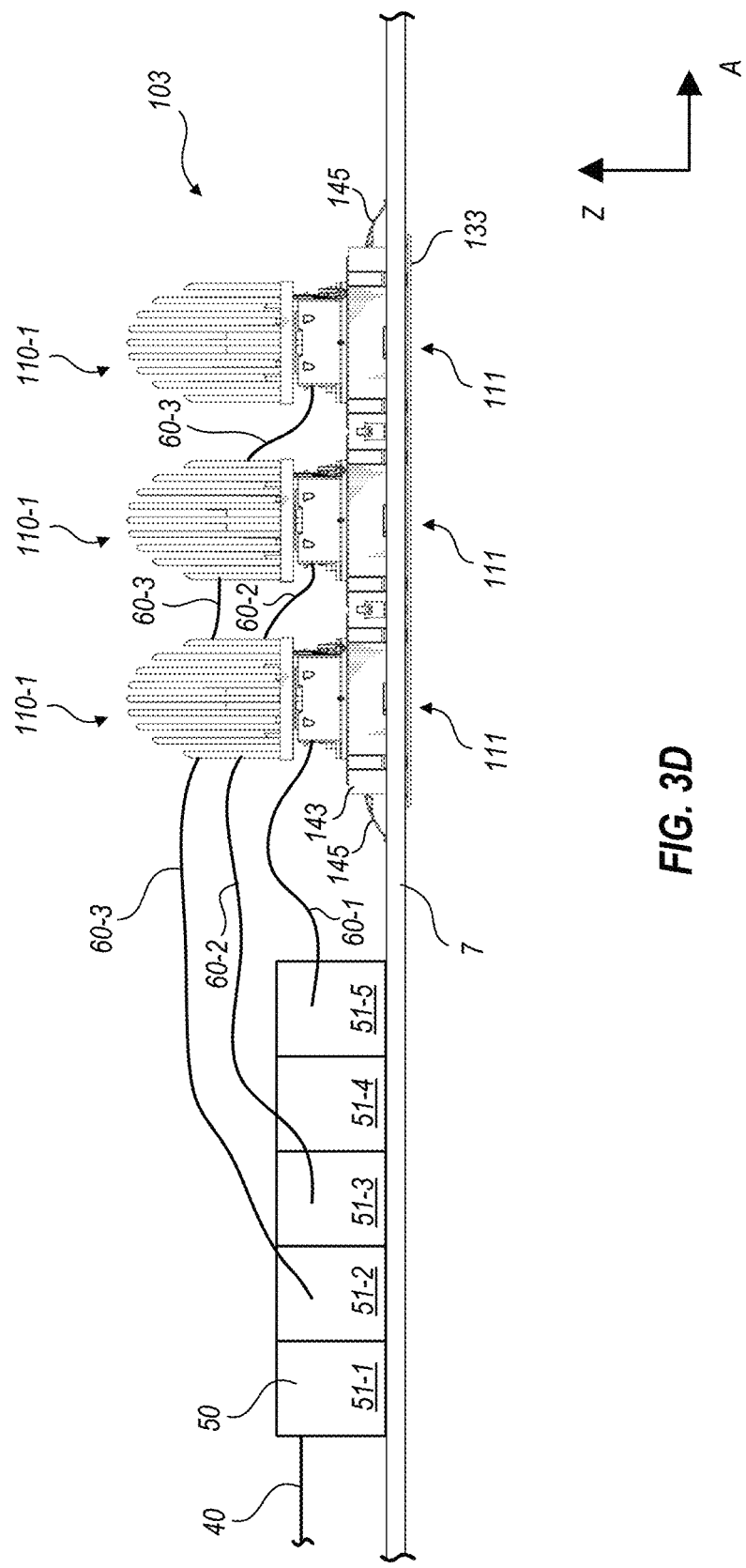
FIG. 3D is a schematic side elevation of the quiet-ceiling light fixture of FIG. 2B, as installed in a mounting surface, illustrating a power supply that supplies power to the light fixture, according to an embodiment.

FIG. 3A is a schematic, upward looking, exploded isometric view of quiet-ceiling light fixture 103, illustrating a mounting surface 7 with an aperture 23 into which light fixture 103 may be installed. Mounting surface 7 that forms aperture 23 may be, for example, ceiling 5 (FIG. 1) but may also be any other structure, such as a wall. FIG. 3B is a schematic side elevation of light fixture 103. FIG. 3C is a schematic cross-sectional view of light fixture 103, taken at line 3C-3C in FIG. 3A. FIG. 3D is a schematic side elevation of light fixture 103 as installed in mounting surface 7, illustrating a power supply 50 that supplies power to light fixture 103. Each of FIGS. 3A, 3B, 3C and 3D provides axes denoting vertical (Z), axial (A) and lateral (L) directions as applicable to each drawing.

Quiet-ceiling light fixture 103 includes a housing 143 that couples with mounting surface 7 using spring clips 145. In certain embodiments, length L of housing 143 is 10¾ inches along the axial direction, and a corresponding width in the lateral direction is 2¾ inches. Trim piece 133 can be decoupled (e.g., unsnapped) and removed from housing 143, and with trim piece 133 removed, spring clips 145 can be accessed so as to decouple spring clips 145 from mounting surface 7. Advantageously, both removal of trim piece 133 and decoupling of spring clips 145 can be performed from an illustrated light-emitting side 106 of light fixture 103 (e.g., the underside, when light fixture 103 is mounted in a ceiling). With spring clips 145 so decoupled, light fixture 103 can drop from (or be pulled out of) mounting surface 7 in order to install and/or field reconfigure light fixture 103. A baffle 123 couples with housing 143 at attachment points 153. Advantageously, with trim piece 133 removed, baffle 123 can also be accessed from light-emitting side 106 to decouple baffle 123 from housing 143 to install light fixture 103, and/or reconfigure light fixture 103 after installation, as discussed further below. All of the decoupling steps can be reversed after reconfiguration of light fixture 103; that is, after appropriate adapter plates 150 and light engines 110 are coupled with manifold housing 143, spring clips 145 can be re-engaged with surface 7 and trim piece 133, or a different trim piece, can be recoupled with housing 143.

Although not shown in the drawings for clarity of illustration, an optional cover plate may be retained by trim piece 133 to cover all or a portion of the output aperture of the light fixture 103. The cover plate can be made of any material that permits light to exit the fixture 103. The cover plate may also provide features such as a diffusing surface, backlit signage and the like. Also, trim pieces herein are not limited to the configuration shown in FIGS. 3A and 3C, which include a flat outer portion that transitions to an angled or sloping inner portion near the edge of manifold housing 143. For example, trim pieces may be substantially flat and parallel with a mounting surface, or may include portions that transition in other ways, such as having rounded inner and/or outer edges. In certain embodiments, use of LEDs as light sources within light engines 110-1 enables light engines 110-1 to be small enough to allow 3½ inch center-to-center spacing of light engines 110 without interference with one another, irrespective of tilt or swivel adjustment. This, in turn, allows an inner aperture of trim piece 133 to be as small as 1½ inches wide (lateral direction) by 9¾ inches long (axial direction).

In FIGS. 3A, 3B, 3C and 3D, baffle 123 defines three light engine positions 111, as shown. Because housing 143 supports multiple light engine positions 111, housing 143 and other housings herein are sometimes referred to as "manifold housings." However, the term "manifold housing" herein can either mean such housings that define or encompass one, or more than one, light engine position. In FIGS. 3A, 3B, 3C and 3D, each light engine position 111 is associated with a light engine 110-1, but light fixture 103 can be configured to use other types of light engines 110, as discussed below. Adapter plates 150-1 that are configured to support light engine 110-1 include one or more coupling features 144 that couple with one or more corresponding, complementary coupling features 148 of housing 143 (not labeled in FIGS. 3A, 3B, 3C and 3D for clarity of illustration; see FIG. 12). Each adapter plate 150-1 forms an aperture 160-1 sized for its associated light engine 110-1 to transmit light therethrough. Light engine positions 111 are separated by a spacing that is sufficient to provide clearance for adjustable light engines 110-1 to rotate (e.g., up to about 360 degrees azimuthally in some embodiments) and tilt (e.g., up to 40 degrees from vertical) without interfering with one another, as discussed below.

Baffle 123, illustrated in FIGS. 3A and 3C, is configured so as to form a high angle glare shield between adjacent light engines 110. Baffle 123 includes one or more coupling features 188 (see FIGS. 6A, 6B) at each light engine position 111 for coupling with housing 143. In some embodiments, baffle 123 is configured such that along axial direction A of light fixture 103, baffle 123 blocks light from each light engine 110-1 that is emitted at a cutoff angle α greater than 55 degrees from nadir. Similarly, trim piece 133 blocks light from each light engine 110-1 that is emitted at a vertical angle greater than 55 degrees from nadir in the lateral direction L, such that light fixture 103 is glare free (e.g., emits no significant light at angles above about 55 degrees) in any direction. Baffle 123 can be configured to provide further aesthetic benefits, as described further below.

FIG. 3C illustrates a light source 112 (e.g., an LED) within each light engine 110-1. As illustrated in FIG. 3D, in operation a power supply 50 obtains power for light fixture 103 from external power 40, and distributes the power to light sources 112 within engines 110 through connections 60-1, 60-2 and 60-3. Power supply 50 is illustrated as including five power supply modules 51-1, 51-2, 51-3, 51-4 and 51-5, however it will be appreciated that a power supply may have as few or as many modules 51 as needed or desired to power an intended number of light engines 110. Having a minimum number of modules 51 needed for a given installation may be most cost effective. However, for flexibility in manufacturing and installation, it may be advantageous to manufacture and deploy power supplies 50 with extra modules 51 of different power supply module types that support a wide range of power outputs, and/or multiples of certain power supply module types, for light engines 110. This enables physical shipments and installations to be more uniform, but allows for on-site customization and reconfigurability. For example, a power supply 50 may provide one, two or three each, of power supply module types 51 that can power light engines that deliver 500 lumens or less, 750 lumens, 1000 lumens, 1250 lumens, or 1500 lumens or more. FIG. 3D also shows power supply 50 connected with external power 40 and disposed atop mounting surface 7 (e.g., a ceiling).

Referring back to FIG. 3A, installation of light fixture 103 typically begins by forming aperture 23 in mounting surface 7, passing power supply 50 through aperture 23, wiring external power 40 to power supply 50, and resting power supply 50 on mounting surface 7. Then, light fixture 103 is passed substantially through aperture 23 with spring clips 145 retracted within housing 143, and spring clips 145 are extended through housing 143 so as to rest on a top side of mounting surface 7. Finally, trim piece 133 is coupled with housing 143 on a facing side of mounting surface 7, to provide a finished appearance. Reconfiguration of light fixture 103 can include first disengaging trim piece 133 and/or spring clips 145, dropping housing 143 out of aperture 23, electrically decoupling a light engine from the power supply, followed by the installation steps above to couple the same or a different light engine to the same or a different power supply module, and reinstall light fixture 103 in mounting surface 7.

Figure 4A:
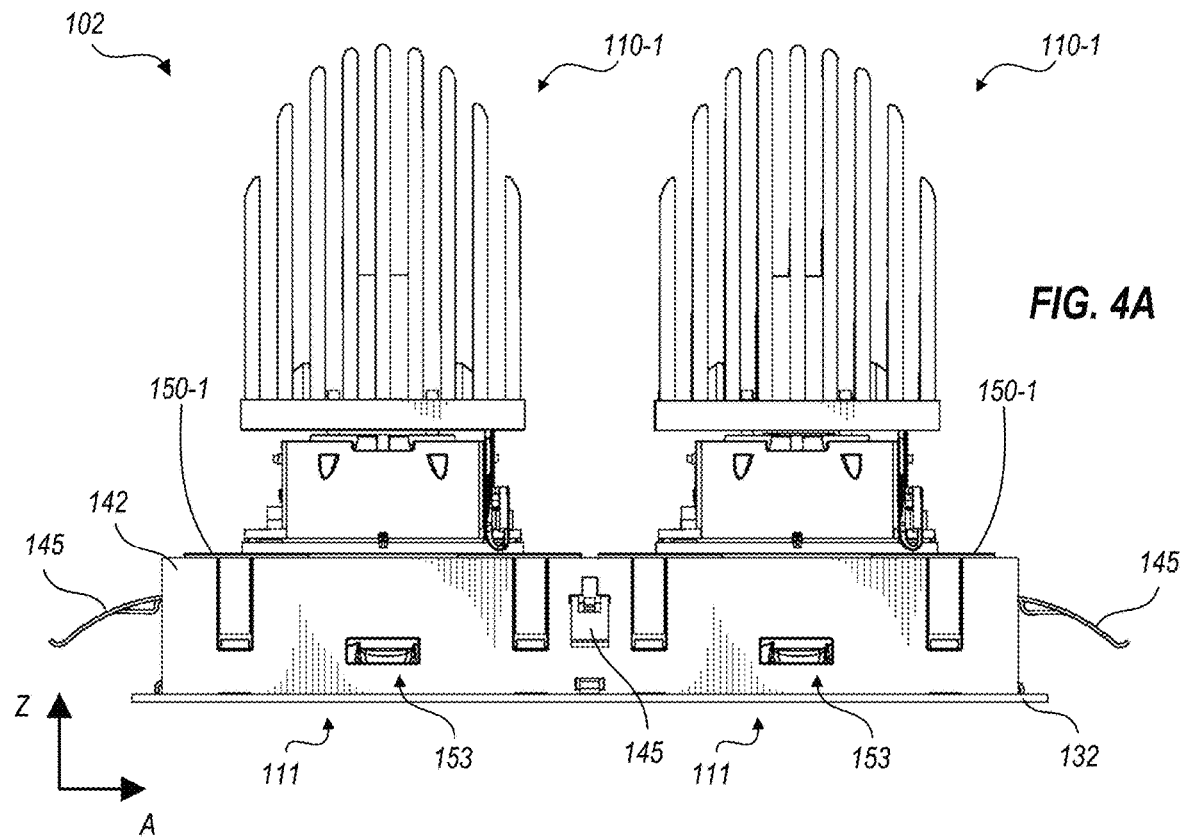
FIG. 4A is a schematic side elevation of the quiet-ceiling light fixture of FIG. 2A.
Figure 4B:
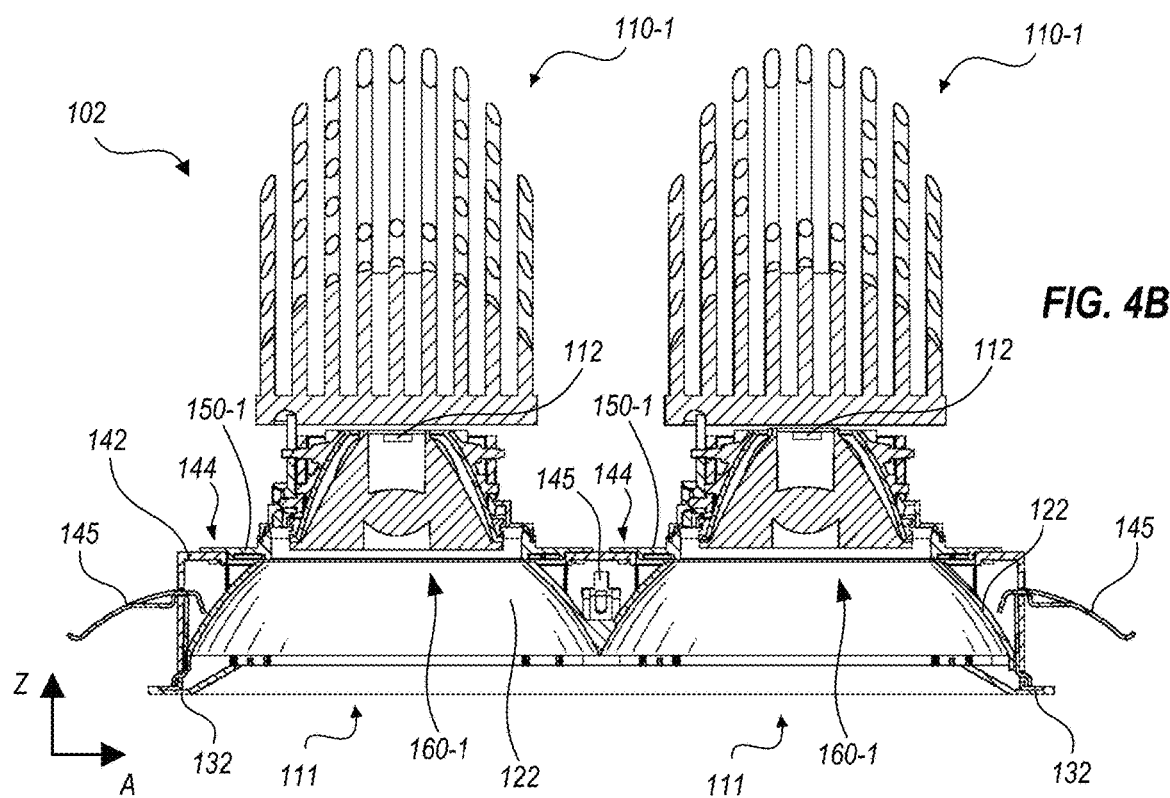
FIG. 4B is a schematic cross-sectional view of the quiet-ceiling light fixture of FIG. 2A, taken along the axial direction at a lateral midpoint thereof.

FIG. 4A is a schematic side elevation of quiet-ceiling light fixture 102. FIG. 4B is a schematic cross-sectional view taken along the axial direction at a lateral midpoint of fixture 102. Each of FIGS. 4A and 4B provides axes denoting the vertical (Z) and axial (A) directions.

Light fixture 102 includes the same functionality as light fixture 103 except that only two light engine positions 111 are present, with two light engines 110-1 mounted therein. Baffle 122, trim piece 132 and housing 142 that encompass the length of light fixture 102 are similar but different (e.g., shorter) elements than the corresponding elements of light fixture 103. However, light engines 110-1, coupling features 144, spring clips 145 and adapter plates 150-1 with apertures 160-1 therein are identical to the same features illustrated in light fixture 103, FIGS. 3A, 3B and 3C.

Figure 5A:
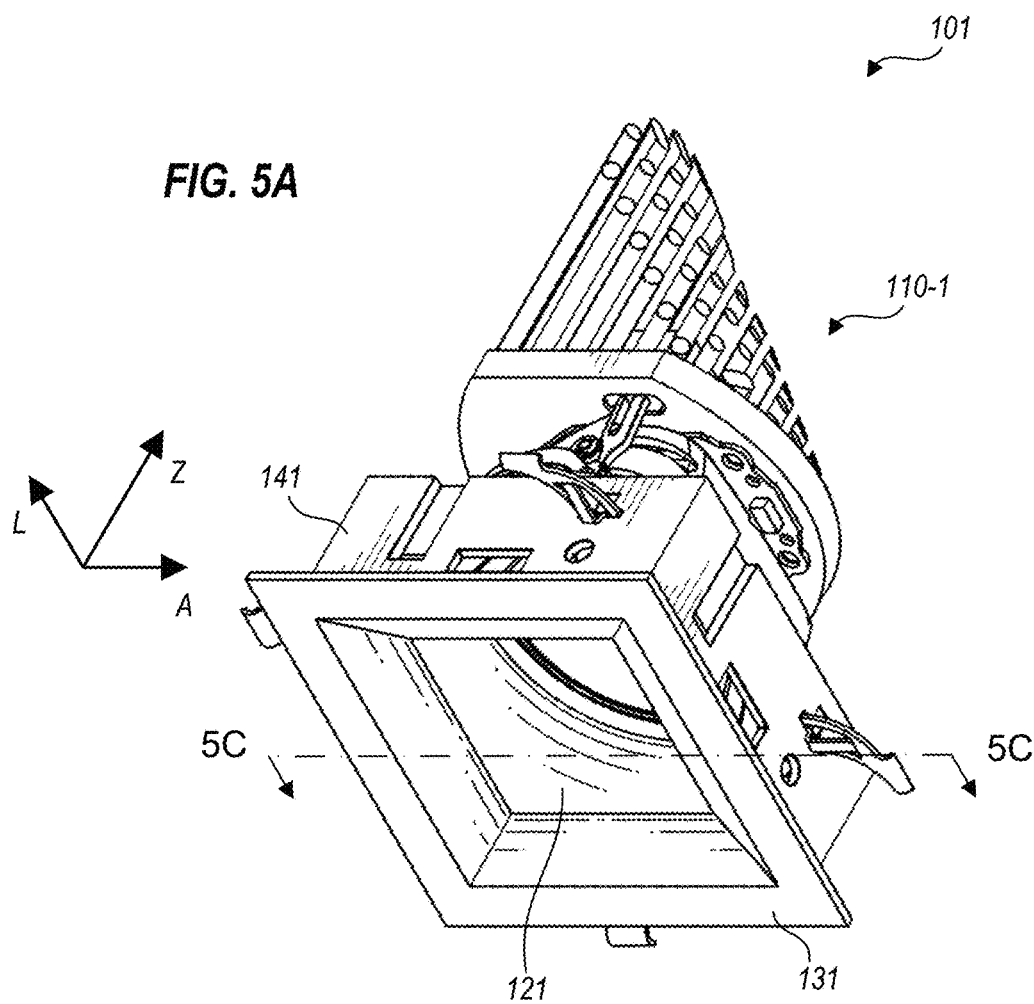
FIG. 5A is a schematic, upward looking isometric view of a quiet-ceiling light fixture, according to an embodiment.
Figure 5B:
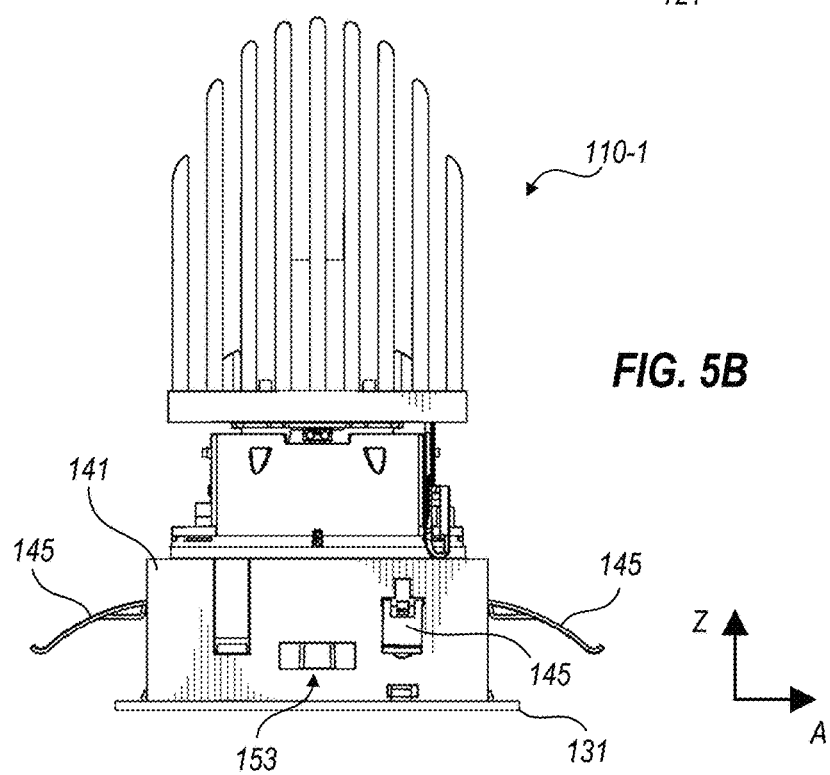
FIG. 5B is a front view of the quiet-ceiling light fixture of FIG. 5A.
Figure 5C:
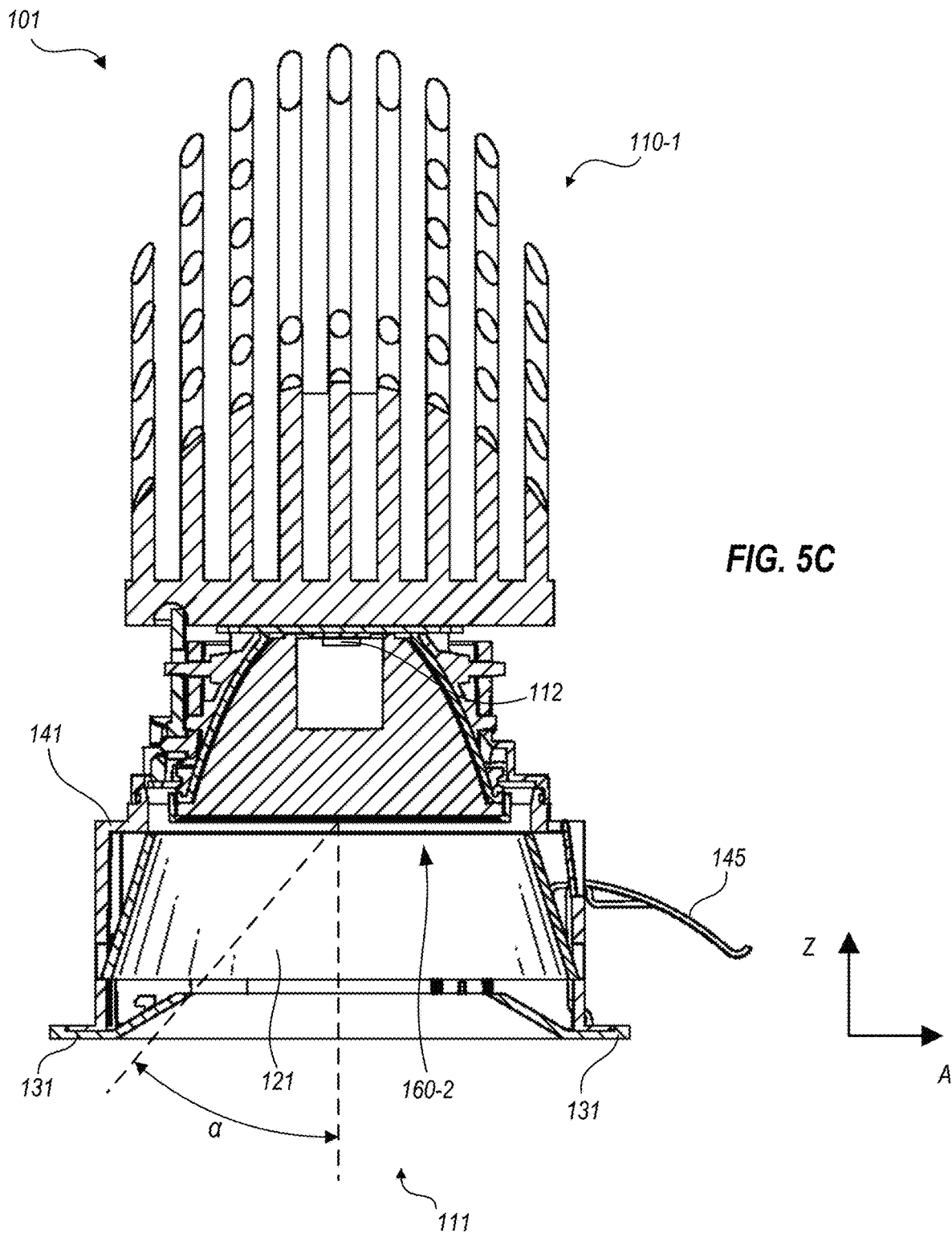
FIG. 5C is a schematic cross-sectional drawing of the quiet-ceiling light fixture of FIG. 5A.

FIG. 5A is a schematic, upward looking isometric view of a quiet-ceiling light fixture 101, which is similar to light fixtures 102, 103. FIG. 5B is a front view of quiet-ceiling light fixture 101, and FIG. 5C is a schematic cross-sectional drawing of quiet-ceiling light fixture 101 taken along line 5C-5C in FIG. 5A. Each of FIGS. 5A, 5B and 5C provides axes denoting vertical (Z), axial (A) and lateral (L) directions as applicable to each drawing.

Light fixture 101 includes similar functionality as light fixtures 102 and 103. In light fixture 101, only one light engine position 111 is present, with one light engine 110-1 mounted therein. Light fixture 101 may also include other structural differences as compared with, for example, light fixtures 102, 103. For example, in the embodiment illustrated in FIG. 5A, housing 141 (and associated trim piece 131) is square in plan outline, with baffle 121 being circular in cross section (e.g., a truncated cone). Other embodiments may be rectangular in plan outline, with an associated baffle being a version of baffles 122 or 123 cut down to support a single instance of light engine 110-1. In the illustrated embodiment, light engine 110-1 couples directly with housing 141, using no adapter plate. Housing 101 thus forms an emission aperture 160-2 for light from light engine 110-1 at light engine position 111, instead of the emission aperture being formed in an adapter plate. In other embodiments, however, an adapter plate may be used with light fixture 101. Quiet-ceiling light fixture 101 includes a housing 141 that couples with a mounting surface using spring clips 145, in similar manner as light fixtures 102, 103. When coupled with housing 141, trim piece 131 provides a cutoff angle α of less than 55 degrees from nadir, along each of the axial and lateral directions, to eliminate high angle glare.

Figure 6A:
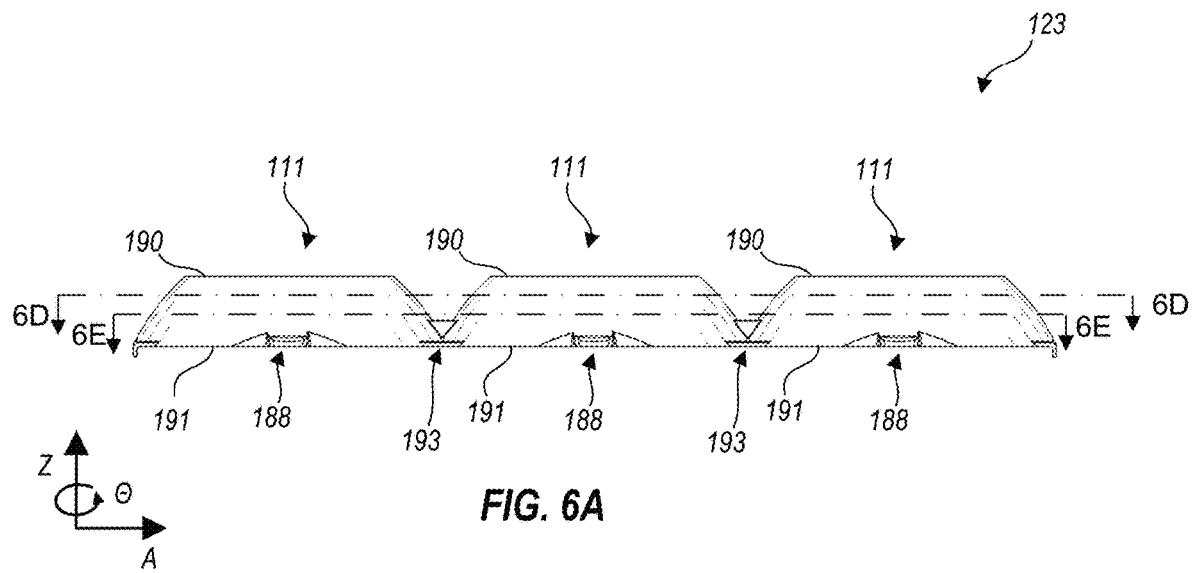
FIG. 6A is a schematic side view of a baffle of the quiet-ceiling light fixture of FIG. 2B, according to an embodiment.
Figure 6B:
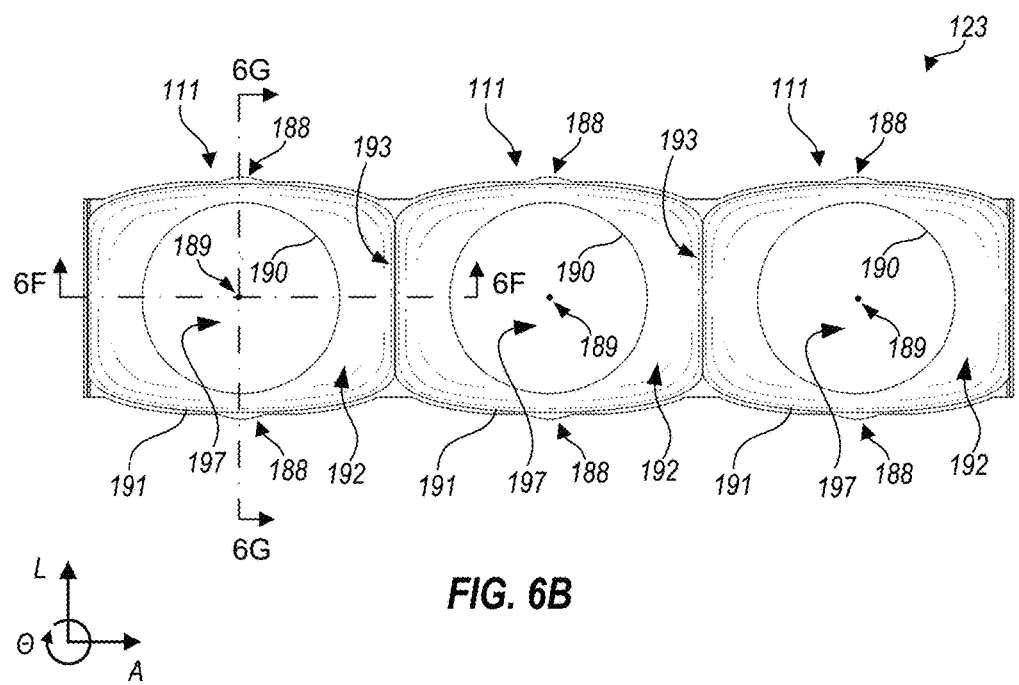
FIG. 6B is a schematic, upward looking bottom plan view of the baffle of FIG. 6A.
Figure 6C:
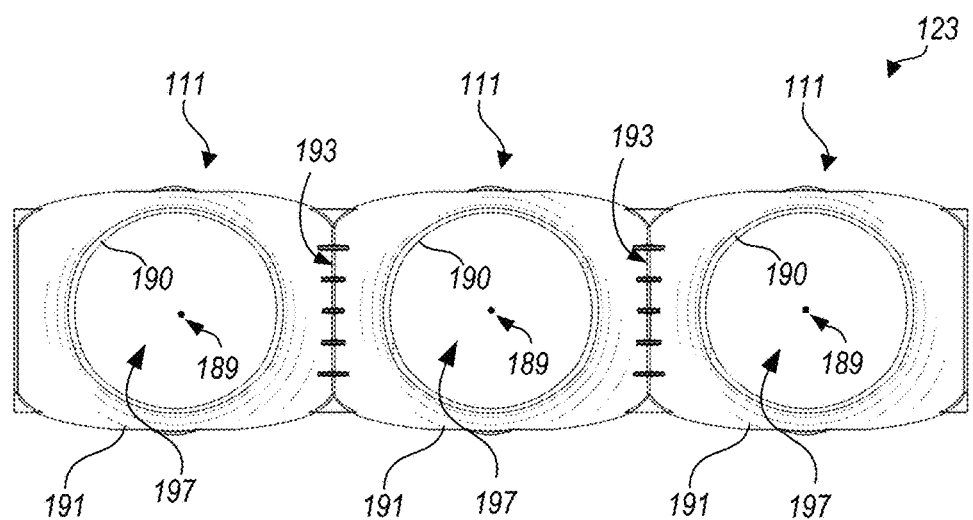
FIG. 6C is a schematic, downward looking top plan view of the baffle of FIG. 6A.
Figure 6C:
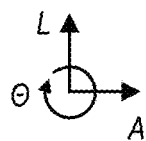
Figure 6D:
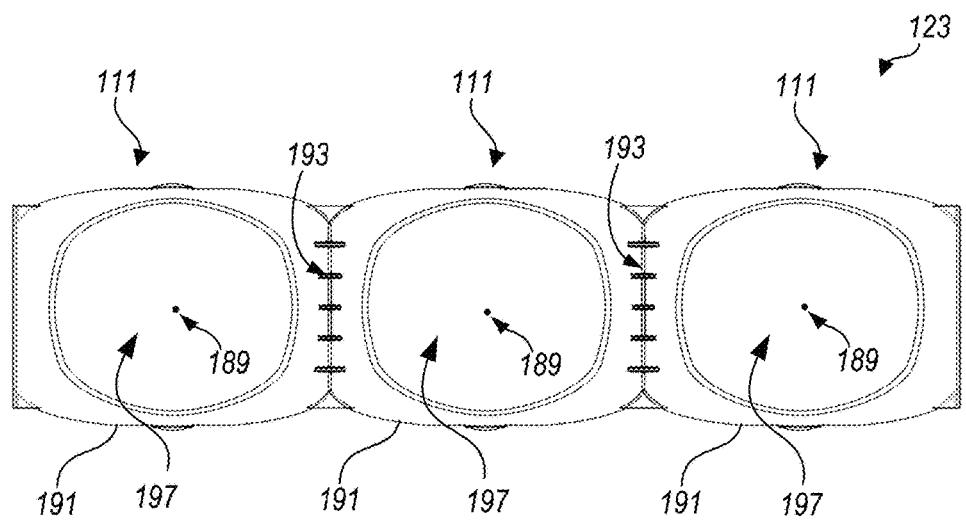
FIG. 6D is a schematic, downward looking cross-section of the baffle of FIG. 6A, at about two-thirds of the height of the baffle.
Figure 6D:
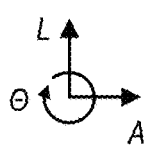
Figure 6E:
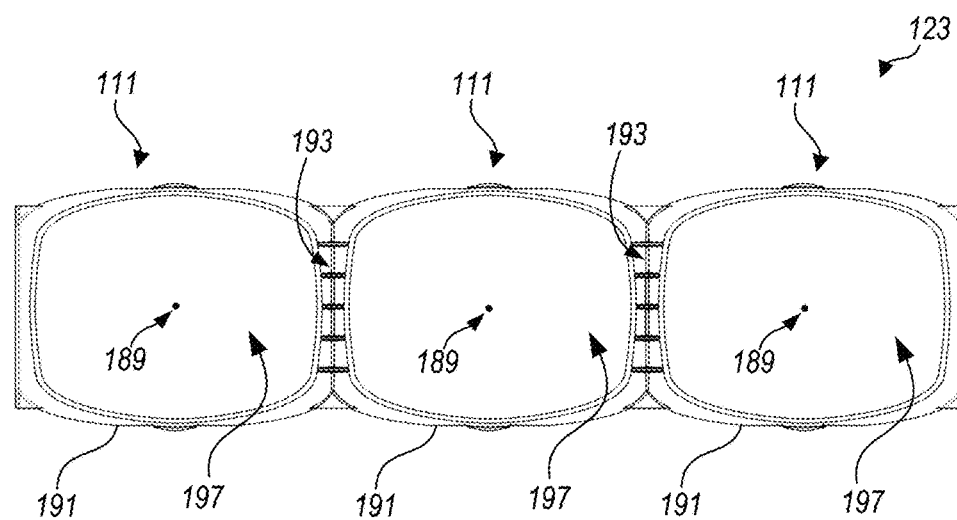
FIG. 6E is a schematic, downward looking cross-section of the baffle of FIG. 6A, at about one-third of the height of the baffle.
Figure 6E:
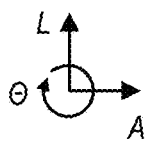
Figure 6F:
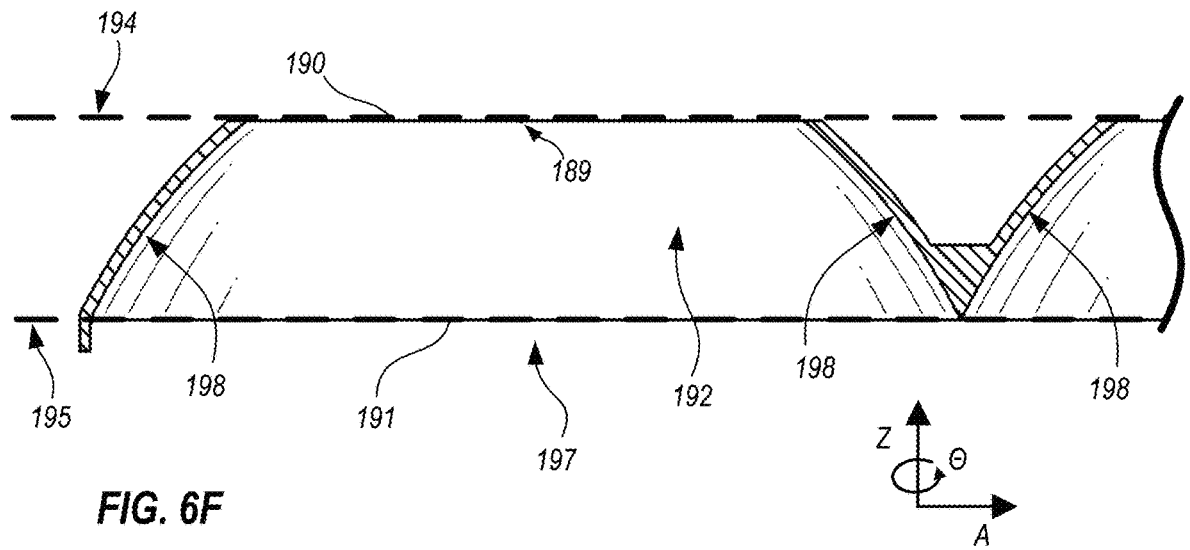
FIG. 6F is a schematic, cross-sectional view of the baffle of FIG. 6A, taken at lines 6F-6F in FIG. 6B.
Figure 6G:
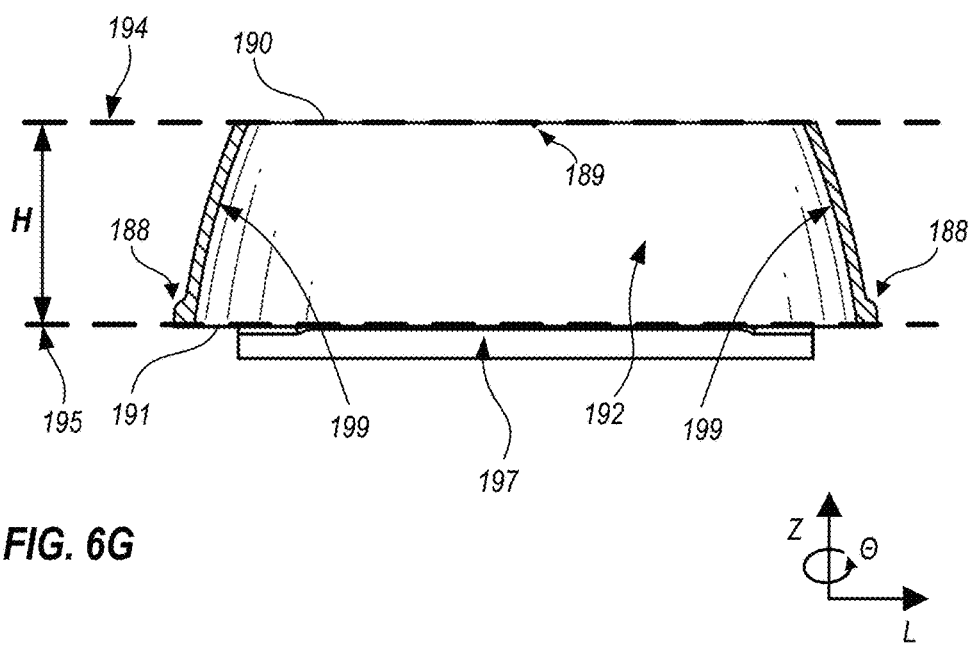
FIG. 6G is a schematic, cross-sectional view of the baffle of FIG. 6A, taken at lines 6G-6G in FIG. 6B.

FIG. 6A is a schematic side view of baffle 123 of quiet-ceiling light fixture 103. FIG. 6B is a schematic, upward looking bottom plan view of baffle 123. FIG. 6C is a schematic, downward looking top plan view of baffle 123. FIG. 6D is a schematic, downward looking cross-section of baffle 123, at about two-thirds of the height of baffle 123. FIG. 6E is a schematic, downward looking cross-section of baffle 123, at about one-third of the height of baffle 123. FIG. 6F and FIG. 6G are schematic, cross-sectional views of baffle 123, taken at lines 6F-6F and 6G-6G, respectively, in FIG. 6B. Each of FIGS. 6A through 6G provides axes denoting vertical (Z), axial (A) and lateral (L) directions, as applicable to each drawing. Also indicated is a direction of an azimuthal angle θ, useful in discussing geometries of each light engine position 111 relative to a centroid 189 of each light engine position 111.

The illustrated baffle 123 may be formed, for example, of plastic and/or metal, and surfaces of baffle 123 may have a diffusely reflective, a specularly reflective, or an opaque, absorptive finish, depending on an application for which a given light fixture is intended. Baffle 123 may also be provided with a painted or stained finish of any color, to provide visual interest. Baffle 123 demonstrates several useful geometric features that should be understood as but one example of a baffle embodiment herein. Baffle 123 spans three light engine positions 111 and defines three baffle cells—one for each light engine position 111. Although the illustrated shape of each baffle cell of baffle 123 is identical for each light engine position 111, other embodiments are possible in which the baffle cells of baffle 123 differ in shape among light engine positions. An aperture 197 extends through baffle 123 at each baffle cell or light engine position 111, centered about a centroid 189 of each cell or light engine position 111, as illustrated; each aperture 197 provides clearance for emission of light from an associated light engine 110 (e.g., as shown in FIGS. 1 through 5C). Bounding each baffle cell are an upper edge 190, a lower edge 191 and an interior baffle surface 192 that extends from upper edge 190 to lower edge 191. Upper edge 190 lies within an upper region 194, and lower edge 191 lies within a lower region 195 that are planes in FIG. 6G, although upper region 194 and lower region 195 may not be planes in other embodiments. Upper edge 190 encircles a light emitting aperture for a light engine to be installed above baffle 123, while lower edge 191 encircles an output aperture of baffle 123. Lower edges 191 of adjacent baffle cells meet to form dividers 193, as illustrated. Dividers 193 thus extend in the lateral direction, axially midway between adjacent cells of baffle 123. By blocking high angle light, dividers 193 help to reduce glare from light sources positioned above baffle 123, especially in the axial direction, as discussed above. It can be seen by comparing FIG. 6C, a top plan view, with FIGS. 6D and 6E, which are cross-sectional views at increasing depth within baffle 123, that aperture 197 is round at upper edge 190 of baffle 123. Aperture 197 then widens and begins to take on a rectangular aspect as the cross-sectional plane proceeds downward through baffle 123, but aperture 197 does not form angles at any depth, including at lower edge 191, best seen in bottom plan view FIG. 6B. FIGS. 6A and 6B also label coupling features 188, which couple baffle 123 with housing 143 by seating within attachment points 153 (see FIGS. 3A, 3B, 4A) to improve mechanical stability of light fixture 103.

Advantageously, at each light engine position 111, interior baffle surface 192 is continuously and downwardly concave from upper edge 190 to lower edge 191. For example, FIGS. 6F and 6G illustrate axial side profiles 198 and lateral side profiles 199 respectively. Axial side profile 198 and lateral side profile 199 are continuously and downwardly concave, meet upper edge 190 at their upper ends, and meet lower edge 191 at their lower ends. Also advantageously, as illustrated in FIGS. 6B through 6E, plan view shapes of upper edges 190 and lower edges 191 are configured to be devoid of angles. "Plan view shapes" herein refers to an inner border or each of the physical upper and lower edges, in a horizontal plane. This excludes any angles that may be formed in vertical directions such as angles formed by the top or bottom surface of the baffle where it intersects the side profile. Plan view shapes also mean that upper or lower edges that lie in non-planar regions 194, 195 would be evaluated based on their projection to a horizontal plane (which is moot when regions 194, 195 are already in horizontal planes, as illustrated in FIGS. 6F, 6G).

Thus, when plan view shapes are considered, although upper edges 190 and lower edges 191 may have straight segments, all corners or angles between such segments are rounded, with the additional condition that the rounded corners deviate smoothly from the straight segments. This condition can also be described as plan view shapes of each of upper edges 190 and lower edges 191 being mathematically smooth within their respective planes (e.g., each respective edge 190, 191 has a continuous derivative with respect to azimuthal angle θ, at any angle θ).

When plan view shapes of upper edges 190 and lower edges 191 are devoid of angles, interior baffle surface 192 can also be configured to be devoid of angles. Because interior baffle surface 192 acts as a reflector in certain embodiments, having interior baffle surface 192 be devoid of angles avoids the distracting effect of seeing light that is "trapped" at any such angles, or other effects where optical performance changes noticeably at a particular angle. That is, interior baffle surface 192 will not present visually distracting, fixed features; instead, light reflected by interior baffle surface 192 will move continuously according to changes in angle of view. By providing rounded corners such that plan view shapes of upper edges 190 and lower edges 191 are devoid of angles, baffles can be designed so as to provide fixtures that are, for example, rectangular in outline, and have substantially rectangular light engine positions (e.g., light engine positions 111 discussed above) with quiet-ceiling characteristics. "Substantially rectangular" means herein a closed shape that includes four side segments, a first two of the side segments being parallel to and spaced apart from one another by a first distance, the second two of the side segments being straight, parallel to and spaced apart from one another by a second distance, and oriented at a ninety degree angle with respect the first two side segments. The side segments may be joined by corner segments that are not straight lines, such that the first two straight side segments have a length of at least half the second distance, and the second two straight side segments have a length of at least half the first distance. In the embodiment shown, each of upper edges 190 is a circle, but this is not required; upper and lower edges may be substantially rectangular, circular or oval, or may form other polygonal shapes such as triangles or hexagons, with rounded corners.

Figure 7:
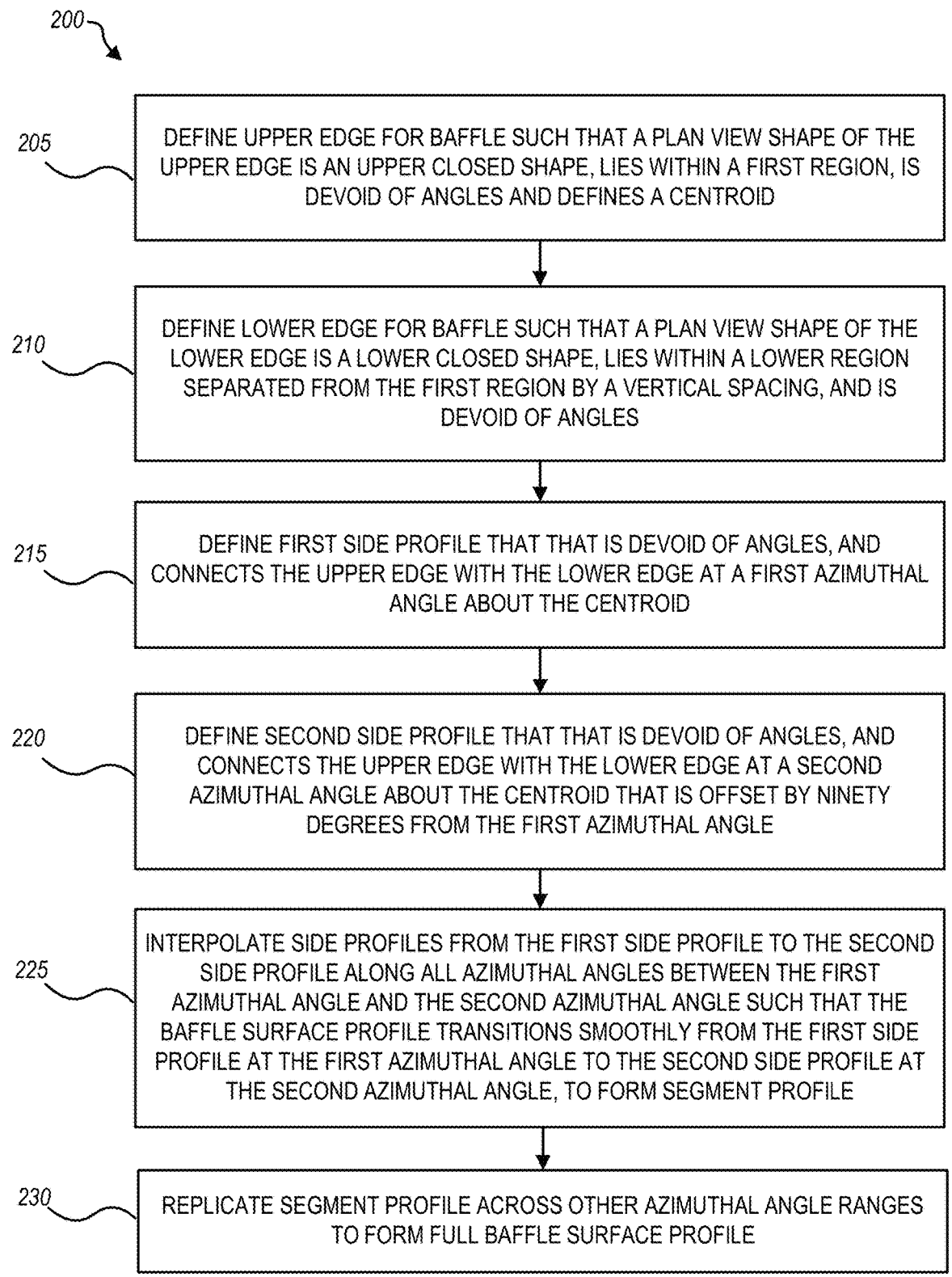
FIG. 7 is a flowchart illustrating a method for generating a prescription for the surface profile for a baffle, in accord with an embodiment.

Referring to FIG. 7, a method 200 for generating a surface profile for a baffle (e.g., interior baffle surface 192) is illustrated. In this description of method 200, references to physical features by reference numeral refer to the features illustrated in FIGS. 6A through 6G. An upper edge for the baffle (e.g., upper edge 190 of baffle 123) is defined in a first step 205. The upper edge forms an upper closed shape that lies within a first region (e.g., upper region 194), and a plan view shape of the upper edge is devoid of angles. The upper edge defines a centroid (e.g., centroid 189). A lower edge for the baffle is defined in step 210. The lower edge forms a lower closed shape that lies within a second region (e.g., lower region 195) that is separated from the first region by a vertical spacing (e.g., height H), and a plan view shape of the lower edge is devoid of angles. A first side profile is defined in step 215. The first side profile (e.g., axial side profile 198) is devoid of angles, and connects the upper edge (e.g., upper edge 190) with the lower edge (e.g., lower edge 191) at a first azimuthal angle about the centroid (e.g., at one of the horizontal extrema of upper edge 190, such as along line 6F-6F in FIG. 6B).

A second side profile is defined in step 220. The second side profile (e.g., lateral side profile 199) is devoid of angles, and connects the upper edge with the lower edge at a second azimuthal angle about the centroid (e.g., one of the vertical extrema of upper edge 190, such as along line 6G-6G in FIG. 6B). The first and second azimuthal angle are chosen based on symmetry of the upper edge and the lower edge, so as to define a segment that can be replicated to form a full baffle surface profile. For example, when one of the upper edge and the lower edge is symmetric in both the axial and lateral directions, horizontal and vertical extrema can be chosen, as noted above, so that the second azimuthal angle is offset by 90° relative to the first azimuthal angle, and the segment defined is a quadrant of the full baffle surface profile. Similarly, if one of the upper edge and the lower edge is substantially an equilateral triangle, the second azimuthal angle can be offset by 120° relative to the first azimuthal angle, and the segment defined is a third of the full baffle surface profile; if one of the upper edge and the lower edge is substantially an isosceles triangle, the second azimuthal angle can be offset by 180° relative to the first azimuthal angle, and the segment defined is a half of the full baffle surface profile, and the like. Although usually one of the upper edges and one of the lower edges will be substantially rectangular with the other edge being either substantially rectangular, circular or oval, it is possible to generate baffle profiles for other shapes by choosing the definitions of baffle segments and first and second azimuthal angles appropriately. For some such choices, it may be necessary to divide the baffle surface into more complex segments.

Side profiles from the first side profile to the second side profile are interpolated in step 225 to form a segment profile. The segment profile (e.g., shape of interior baffle surface 192 within a limited azimuthal angle range) is formed by interpolating side profiles from the first side profile to the second side profile, along all azimuthal angles between the first azimuthal angle and the second azimuthal angle. Because the plan view shape of the upper edge, the plan view shape of the lower edge, the first side profile and the second profile are devoid of angles, the resulting baffle profile will also be devoid of angles, such that the baffle surface profile transitions smoothly from the first side profile at the first azimuthal angle to the second side profile at the second azimuthal angle. Step 230 replicates the segment profile determined at step 225 across other azimuthal angle ranges as necessary to form the full baffle surface profile. It should be understood that replicate can include generating a mirror image of a profile, for example when one of an upper edge and a lower edge is substantially rectangular with the other being circular, a first quadrant profile can be simply rotated to provide a third quadrant profile, but the second and fourth quadrant profiles will be mirror images relative to the first and third quadrant profiles.

When a baffle profile is generated according to method 200, and the lower edge is other than a scaled version of the upper edge, the baffle profile will be a compound azimuthal and vertical profile. That is, the generated baffle profile will be a function of both azimuthal angle and vertical height, an example being the slope of baffle surface 192 at each azimuthal angle between axial side profile 198 and lateral side profile 199 and at each vertical height from lower edge 191 to upper edge 190.

In certain embodiments herein, light engines 110 and baffles 121, 122, 123 provide additional aesthetic effects. For example, in certain embodiments, baffles may be highly reflective for highest illumination efficiency (like a lamp without a lampshade) while in other embodiments, baffles may be provided with a colored finish to provide visual interest (like a colored lampshade used with a lamp). Baffles may be of any color; however, relatively dark colors are preferable. This is because lighter colors may scatter too much light from the nearby light engine 110 to view comfortably, and/or because the viewer's eye, adjusting to the brightness of the light fixture, may perceive the color as a very light, "washed out" color. Light engines 110 may emit light of a color and/or white light of a chosen color temperature; color and/or color temperature may be selected as complementary to a color of the baffle. One of ordinary skill in the art will readily conceive many equivalents, extensions, and alternatives.

Another aesthetic effect of baffles herein is that of providing a clean "flash" across the light fixture as a viewer changes angle (e.g., as the viewer approaches from a distance and walks underneath the fixture). By providing a baffle profile that is continuously and downwardly concave in axial and lateral profiles, embodiments herein provide a baffle interior surface profile that provides continuity of such reflections. That is, a first reflection seen by a distant viewer coming into view of a light engine will be adjacent to the light engine. As the viewer approaches nadir relative to the light engine, the reflection will move from nearby the light engine toward an outer edge of the baffle interior surface.

Figure 8:
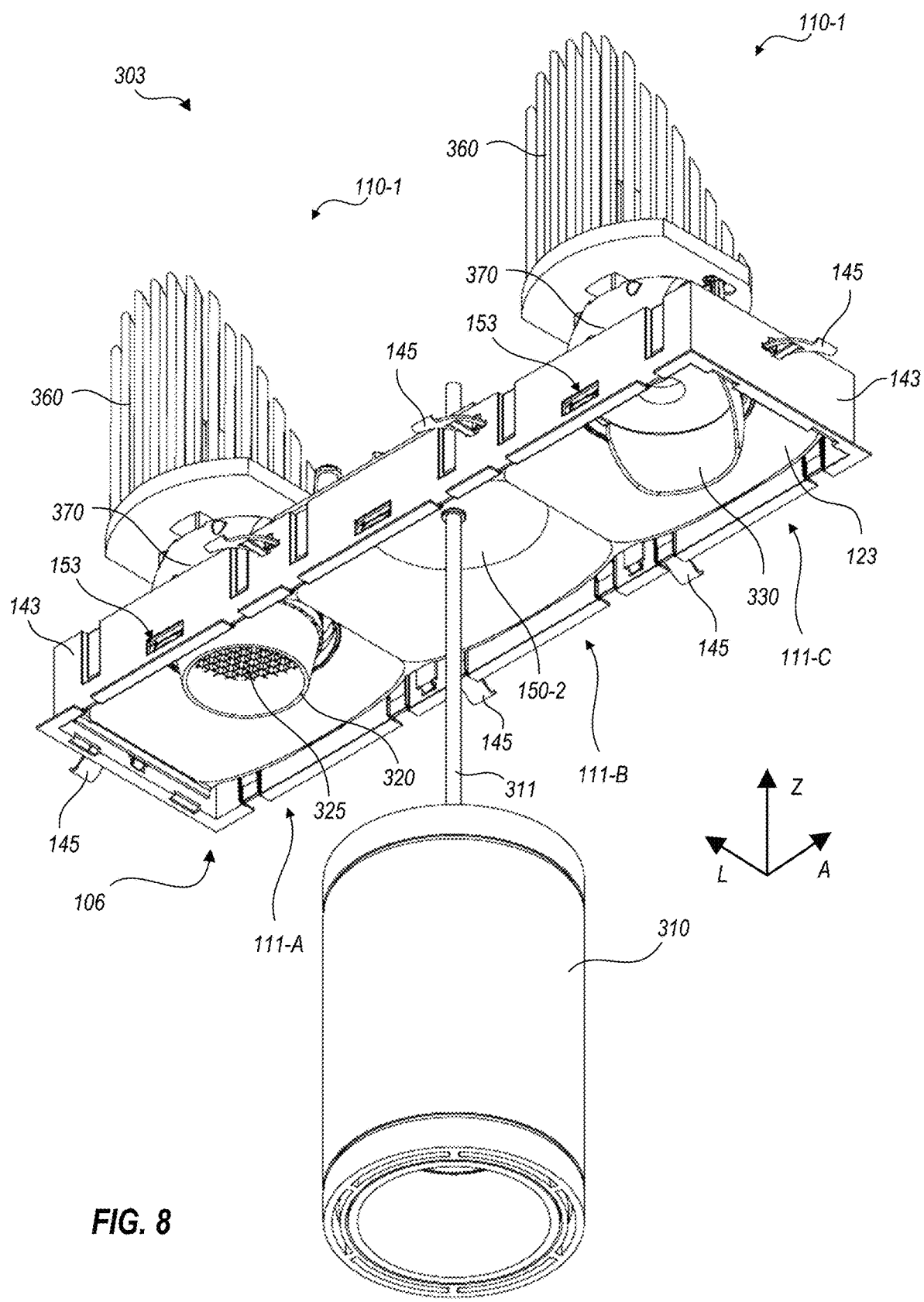
FIG. 8 illustrates, in isometric view, a light fixture that integrates a variety of accessories, in accord with an embodiment.
Figure 9:
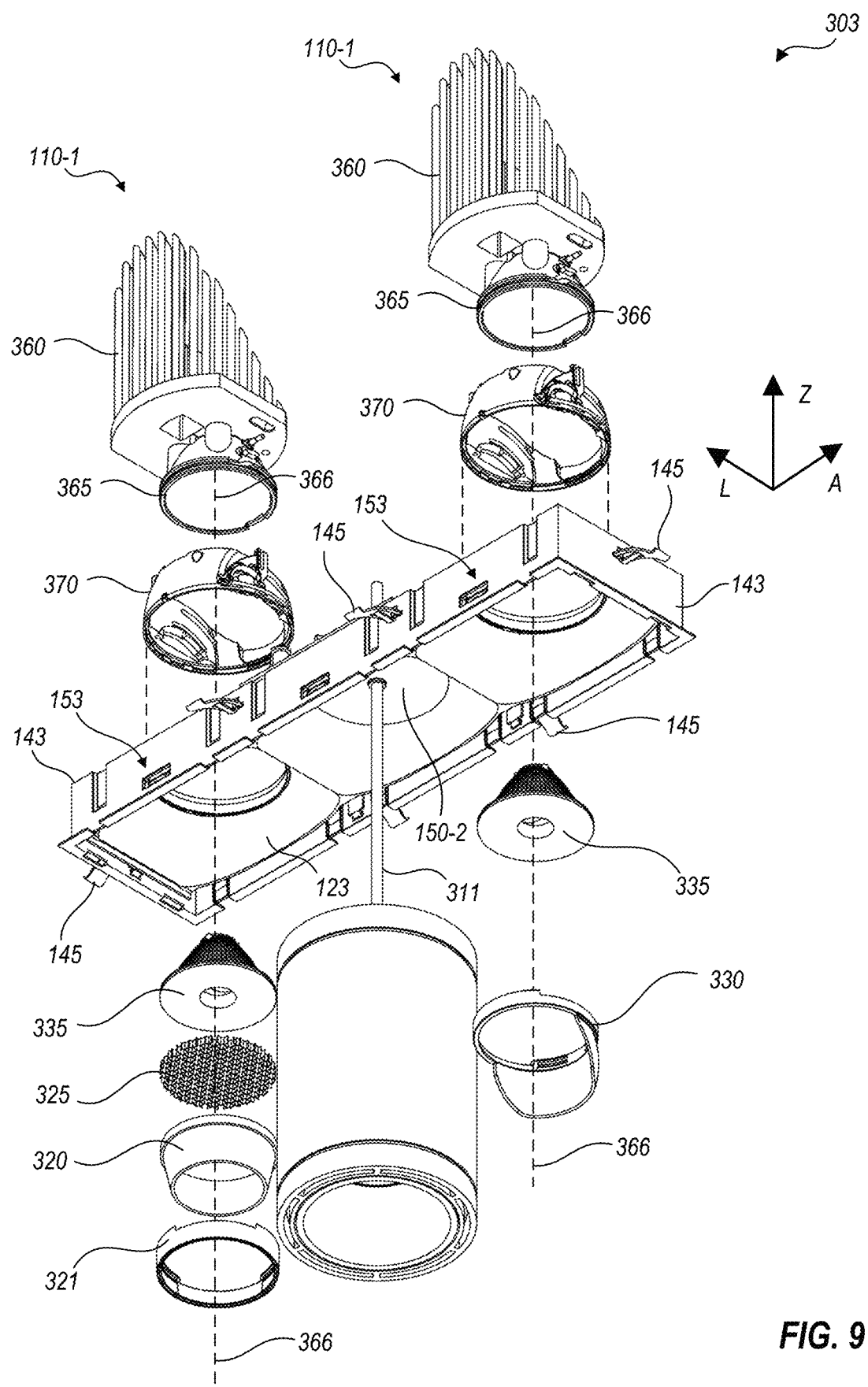
FIG. 9 illustrates, in an exploded view, the light fixture of FIG. 8.

Embodiments herein can be extensively customized through selection and integration of appropriate light engines, baffles, optics, and other accessories. For example, FIG. 8 shows in isometric view, and FIG. 9 shows in an exploded view, a light fixture 303 that integrates a variety of such optional accessories. Like light fixture 103 (FIGS. 1, 2B, 3A-3C), light fixture 303 includes housing 143, trim piece 133, adapter plates (hidden by housing 143 in FIGS. 8 and 9, see FIGS. 3B, 3C, 4A, 4B), spring clips 145, and baffle 123. Light fixture 103 also includes three light engine positions 111; however the features described below are applicable to a fixture having any number of light engine positions. For ease of discussion, the three light engine positions are labeled 111-A, 111-B, and 111-C. It should be understand that embodiments of the present invention may include any type of light engines. Those illustrated and described herein are intended to be exemplary only.

Light engines 110-1 in positions 111-A and 111-C include a heat sink 360 onto which is attached a light source housing 365. In some embodiments, heat sink 360 is the same or similar to embodiments of heat sinks disclosed in U.S. patent application Ser. No. 15/357,188, filed Nov. 21, 2016 and titled "Heatsink," the entirety of which is hereby incorporated by reference. Light sources 112 (such as, but not limited to LEDs, and obscured by light source housing 365 in the view of FIG. 9) are positioned within light source housing 365. For example, light sources 112 may be disposed on a circuit board at an upper surface of light source housing 365.

Each light engine 110-1 includes a light source housing 365 that defines an optical axis 366. Light source housings 365 may engage with respective rotation/tilt housings 370 in a way that permits the light source housing 365 (with associated heat sink 360) and associated optical axis 366 to be tilted as desired. Rotation/tilt housing 370 engages an adapter plate 150-1 (obscured in the view of FIGS. 8 and 9, see FIG. 3C) through a ring that allows housing 370 to rotate with respect to adapter plate 150-1, and each light source housing 365 couples with housing 370 on an axis such that light source housing 365 can tilt up to at least 40 degrees with respect to housing 370 and adapter plate 150-1. Thus, in some embodiments, the rotation/tilt housing 370 is snap-fitted onto adapter plate 150-1, adapter plate 150-1 is snap-fitted onto housing 143, and baffle 123 is snap-fitted onto housing 143 below adapter plate 150-1. Other attachment means for any of these features, such as but not limited to interference fits and coupling with additional fasteners, are contemplated herein.

Each of the light engines 110-1 positioned in positions 111-A and 111-C couple with a primary optic 335 that is received in the light source housing 365 and retained there by a retainer ring. Retainer ring 321 is illustrated in position 111-A, and kicker reflector ring 330 is illustrated in position 111-C, as discussed below, but different retainer ring types may be used in any light engine position. Primary optics 335 may be of the same or of different types in positions 111-A and 111-C. Other optical accessories may also be provided within the light source housing 365 and retained thereon by retainer ring 321 or kicker reflector ring 330. For example, in the illustrated embodiment, a honeycomb insert 325 and a glare shield 320 are positioned below the primary optic 335 in position 111-A. In some embodiments, the retainer ring 321 can secure other optical accessories to the light source housing 365. In some of these embodiments, an axial dimension (i.e., height) of retainer ring 321 is modified so that the retainer ring 321 can span the required components.

Figure 10A:
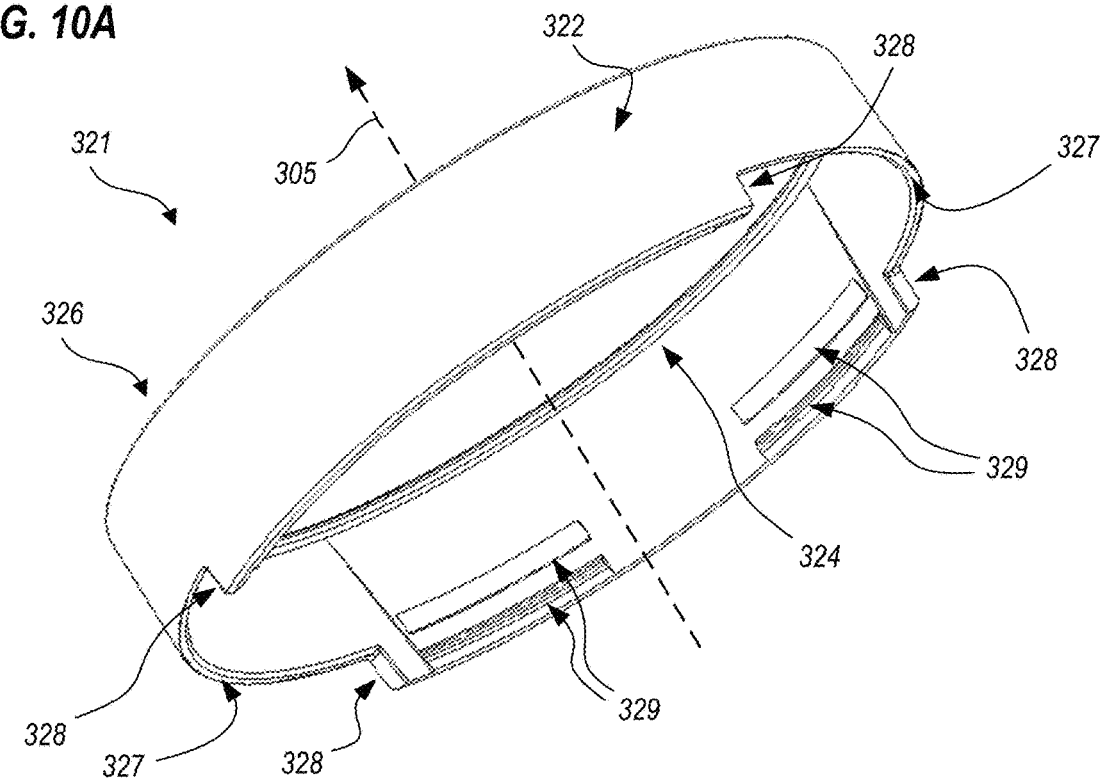
FIG. 10A illustrates, in a first isometric view, a retainer ring for a quiet-ceiling light fixture, in accord with an embodiment.
Figure 10B:
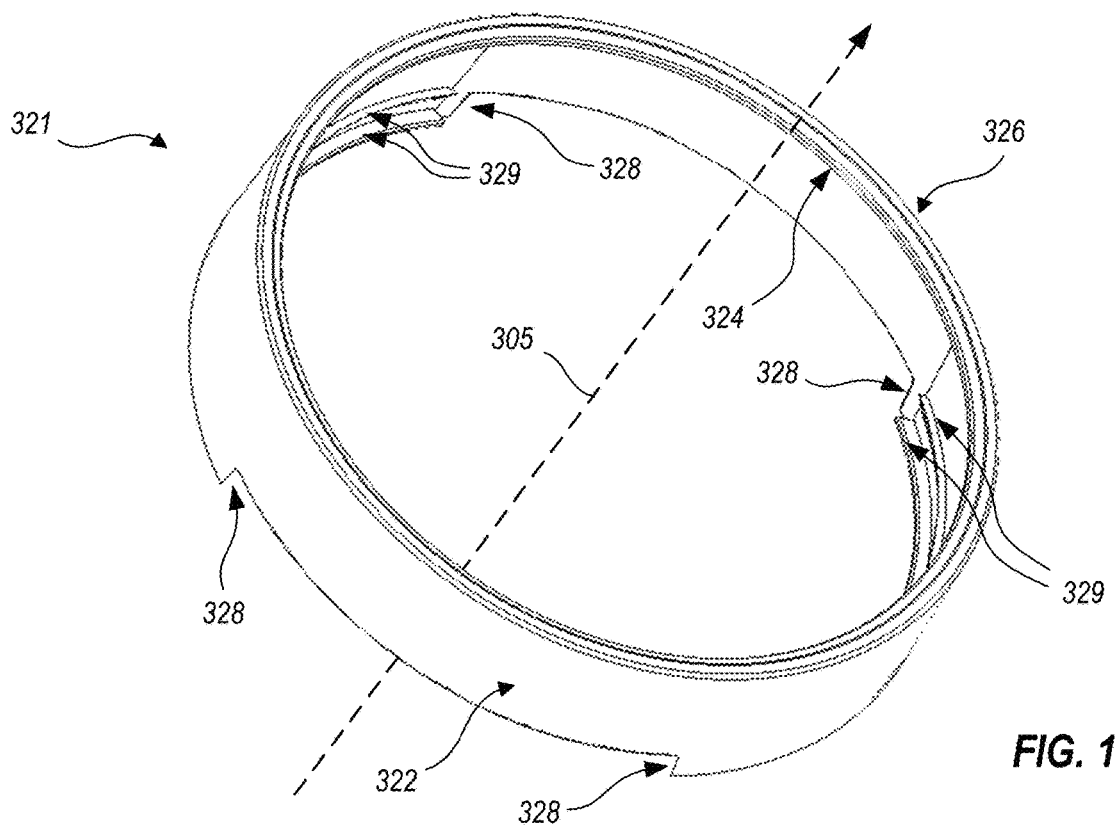
FIG. 10B illustrates, in a second isometric view, the retainer ring of FIG. 10A.

FIGS. 10A and 10B illustrate one such embodiment of a retainer ring 321. Retainer ring 321, illustrated in isometric views in FIGS. 10A and 10B, includes a main body section 322 that defines a cylindrical axis 305. In the embodiment shown, a diameter of main body section 322 is larger than a length of main body section 322 along cylindrical axis 305, but other embodiments of retainer ring 321 that span larger components may have a main body section 322 having a length larger than its diameter. An inner retaining flange 324 extends radially inward from a distal end 326 of retainer ring 321. When installed on a light source housing 365, cylindrical axis 305 coincides with optical axis 366 of the light source housing 365 (see FIG. 9). The desired components (e.g., primary optic 335, glare shield 320, honeycomb insert 325) are retained between retaining flange 324 and light source housing 365. That is, retaining flange 324 supports the components, and couples the components with, the light source housing 365. One or more coupling flanges 328 are shown in FIGS. 10A and 10B as extending axially from a corresponding plurality of positions on a proximal end 327 of the main body section 322, however, coupling flanges 328 may or may not be present. Retainer ring 321 forms one or more coupling features 329 that extend radially inward. Coupling features 329 engage with corresponding features on light source housing 365, FIG. 9. Coupling features 329 are illustrated as nonthreading, radially inward projections extending from coupling flanges 328 in FIGS. 10A and 10B; nonthreading coupling features 329 may be advantageous to allow retainer ring 321 to rotate with respect to a light source housing 365 with which it engages, without loosening the engagement between the two. However, coupling features 329 can also be threads, or projections capable of engaging threads. Also, coupling features 329 may be located on other portions of retainer ring 321. Advantageously, coupling features 329 and the corresponding features of light source housing 365 are configured as ribs so that retainer ring 321 can snap-fit together with light source housing 365 without the use of tools. There are two coupling flanges 328 in the illustrated embodiment, but other embodiments could have more, fewer, or no coupling flanges (that is, coupling features 329 may be integrated directly with main body section 322).

Figure 11A:
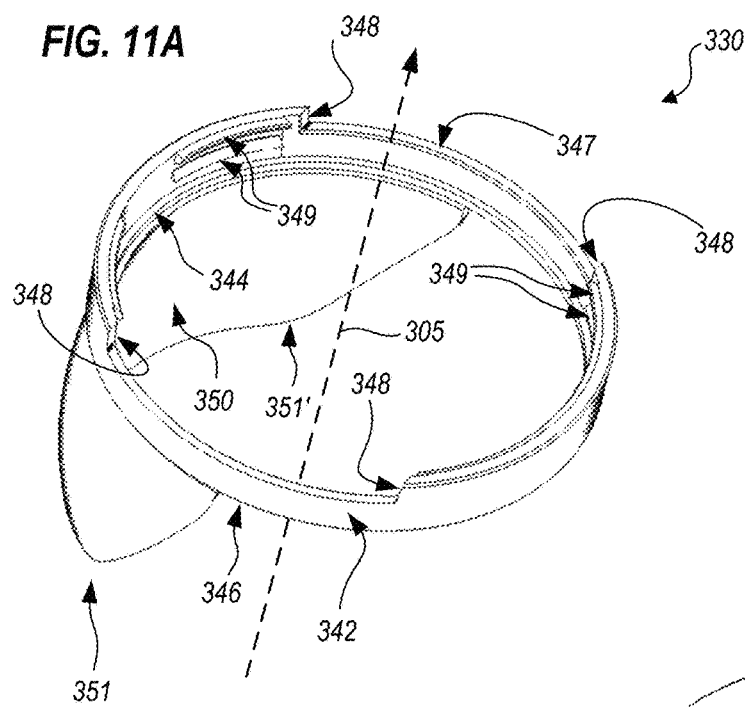
FIG. 11A illustrates, in a first isometric view, a kicker reflector for a quiet-ceiling light fixture, in accord with an embodiment.
Figure 11B:
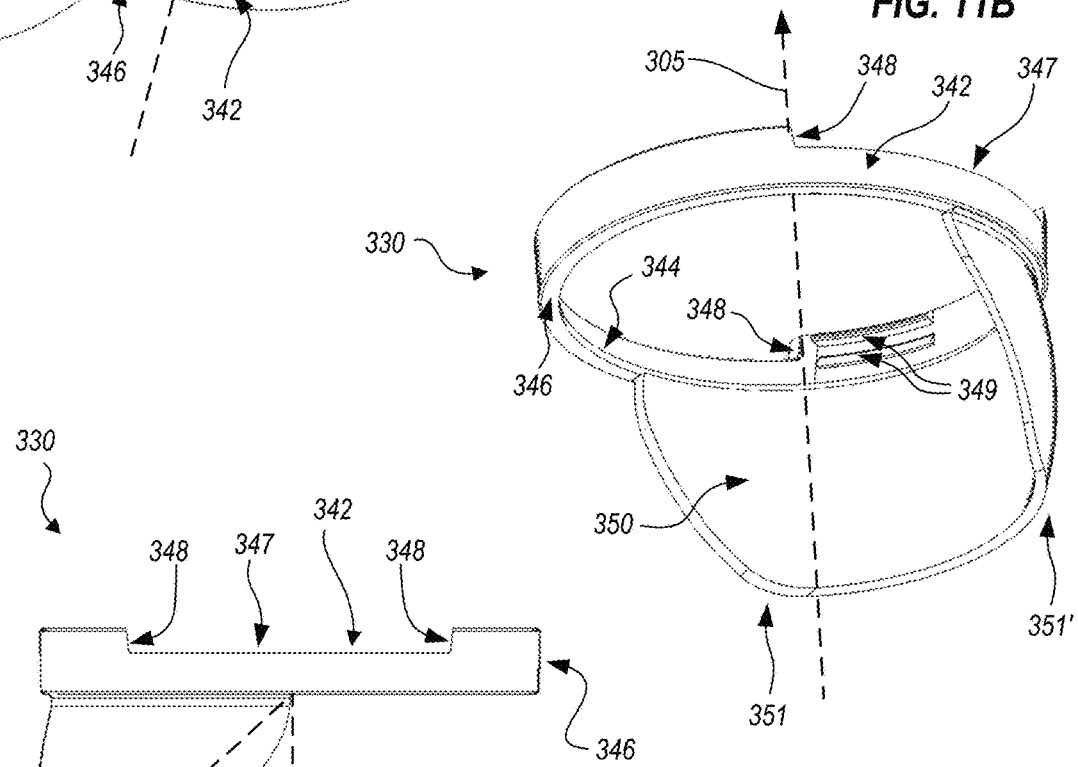
FIG. 11B illustrates, in a second isometric view, the kicker reflector of FIG. 11A.
Figure 11C:
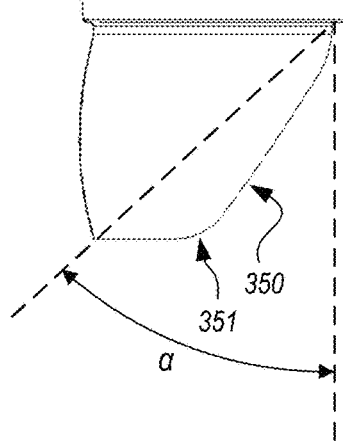
FIG. 11C illustrates, in a side view, the kicker reflector of FIG. 11A.

The light engine 110-1 positioned in position 111-C also includes a primary optic 335 received in the light source housing 365. However, in position 111-C, primary optic 335 is retained by a kicker reflector ring 330 (shown in greater detail in FIGS. 11A, 11B, and 11C). Kicker reflector ring 330 is an example of an optical element (in this case, a reflector) integrated with a retainer ring that provides a similar functionality as retainer ring 321, but adds optical functionality. For example, kicker reflector ring 330 includes a main body section 342 along a cylindrical axis 305, analogous to main body section 322 of retainer ring 321. Main body section 342 of kicker reflector ring 330 may be made with any length along cylindrical axis 305 needed to retain any intended components. A reflector surface 350 extends downwardly from a portion of main body section 342. Kicker reflector ring 330 may be formed, for example, by injection molding and/or machining, and may be made of plastic and/or metal, such as plastic with reflector surface 350 being metallized. An inner retaining flange 344 extends radially inward from a distal end 346 of kicker reflector ring 330. When installed on a light engine (e.g., light engine 110-1), retaining flange 344 couples components such as primary optic 335 with the light engine. One or more coupling flanges 348 extend axially from a corresponding plurality of positions on a proximal end 347 of the main body section 342, with each of coupling flanges 348 forming one or more coupling features 349 that extend radially inward from a proximal end 347 of each coupling flange 348. Coupling features 349 engage with corresponding features on the light source housing 365. There are two coupling flanges 348 in the illustrated embodiment, but other embodiments could have more, fewer, or no coupling flanges. Because of its direct integration with main body section 342, reflector surface 350 is advantageously in close proximity to primary optic 335 such that a significant optical effect—in this case, reflection of a large amount of light output from primary optic 335 toward a preferred direction—can be achieved with a small component. Shoulders 351, 351' of reflector surface may be formed so as to extend further, or not as far, around a circumference of main body section 342, and may be formed with differing height relative to main body section 342, so as to provide differing cutoff angles α illustrated in FIG. 11C at different angles relative to an associated light engine. That is, while α is about 48 degrees in FIG. 11C, and reflector surface 350 subtends an angle of about 180 degrees at its outer edges about a circumference of main body section 342, other reflector surfaces 350 can increase or decrease the cutoff angle, and/or increase or decrease widths of an area that is behind reflector surface 350. Direct integration of reflector surface 350 with main body section 342 also further facilitates user customization of light fixture 303 by being accessible to the user after installation, as discussed below. The direct integration of mechanical and optical features such as reflector surface 350 as part of retainer ring 330 also helps minimize size and part count, and maximize precision alignment of optical features with their associated light engines, by reducing tolerance stack-ups.

Other optical components (such as but not limited to refractive optics, diffusers, and the like) can similarly be integrated into the light engine with retainer rings. Such components may be integrally formed as part of the retainer ring (e.g., by molding a reflector surface with the retainer ring as a one piece component of plastic or other material) or may be coupled with a light engine, using the retainer ring, as discussed above. Portions of the components so integrated may be selectively treated to provide desired optical characteristics, for example by metalizing reflector portions, painting or abrading certain surfaces to modify reflectivity and diffusion characteristics, polishing specular optical surfaces and the like. Sets of components such as primary optics 335 (of the same or different types), honeycomb inserts 325, glare shields 320, gels, filters, all of which are compatible with a light engine and with retainer rings 321 and/or integrated kicker reflectors 330, may be grouped and sold with other components of light fixtures herein as kits for customizing the light fixtures or individual light engines thereof. Upon reading and comprehending the present disclosure, one of ordinary skill in the art will readily conceive many equivalents, extensions, and alternatives.

A pendant luminaire 310 is provided in light engine position 111-B. It is supported by an adapter plate 150-2 that, in turn, engages housing 143 to support pendant luminaire 310 from fixture 303. Electrical power for luminaire 310 may be provided by a cable that passes through center support 311.

Advantageously, some embodiments of light fixtures herein are designed so as to be installed and/or reconfigured from the light-emitting side; that is, below a ceiling, or outside a wall or other inaccessible space. In these embodiments, all that is needed at the installation site is an electrical power source provided by a cable or other suitable connector, behind the surface where the fixture is to be installed. An installer can cut a hole (e.g., aperture 23 in mounting surface 7, FIG. 3A) that is sized and shaped for a housing (e.g., housing 141, 142, 143) of the light fixture. A power supply can be connected to the electrical power source; a power lead from the light fixture can connect with the power supply. The power supply can be pushed into the hole behind the mounting surface. The light fixture can be configured with the desired light engines and accessories. The housing can be inserted into the hole and can couple with the mounting surface (e.g., using spring clips 145). A trim piece (e.g., trim piece 131, 132, 133) can be fitted with the housing to obscure the cut edge of the hole around the housing and provide a clean, finished appearance.

Some of these, and other embodiments, of light fixtures herein are also designed such that the fixtures are re-configurable in the field, with or without removal from the mounting surface. For example, if accessory substitution or a preferred direction of light reflection from a component integrated with a retainer ring is desired, the retainer ring can be turned, or removed to add, remove or substitute a component. Optionally, the trim piece may be removed for more convenient access and replaced after the adjustment or substitution. If a different light engine is desired in an installed fixture, the trim piece and baffle may be removed, the housing may be disengaged from the mounting surface, and the light engine may be disconnected from the power supply. An adapter plate (with the associated light engine) may be removed and replaced with the desired light engine/adapter plate combination. The new light engine may be connected with the power supply, the baffle may then be returned to the fixture, the housing may be returned to its original position in the mounting surface and the trim piece replaced.

Similarly, some embodiments of the fixture also provide for field interchangeable optics. For example, if a different spatial distribution of light is desired, a retainer ring 321, integrated kicker reflector 330 and/or other retainer ring embodiment may be removed from a light engine, the existing optic (e.g., primary optic 335) may be removed, replaced or substituted with a different primary optic or optical accessories designed to provide the desired spatial distribution. The retainer ring 321, integrated kicker reflector 330 or other retainer ring embodiment may then be replaced to couple the primary optic and/or other optical accessories with the light engine.

The modalities discussed above can be used to reconfigure light fixtures herein with many options to support different layers of light from a design standpoint. These include installing or substituting any combination of any of the following, without limitation:
- adding, removing or substituting differing styles of light engine holders such as fixed, tiltable and/or rotatable, pendants;
- adding, removing or substituting light engines that can deliver 500 lumens or less, 750 lumens, 1000 lumens, 1250 lumens, or 1500 lumens or more, of light output intensity per light engine, including light output intensities intermediate to those listed, and including light engines that can provide any chromaticity or color temperature of light;
- adjusting tilt (optical axis of combined light engine plus optics) to zero degrees (nadir), 5°, 10°, 15°, 20°, 25°, 30°, 35°, 40°, 45° or greater, including tilts intermediate to those listed;
- adjusting rotation (azimuthal direction of optical axis) to any rotational angle;
- adding, removing or substituting optics to provide various degrees of beam spread and/or tilted light emission relative to optical axis of light engine;
- adding, removing or substituting opaque or reflective baffles to redirect portions of light from a light engine, and/or to increase or decrease a cutoff angle relative to nadir as discussed in connection with FIGS. 11A-11C;
- adding, removing or substituting films, gels, filters, collimating structures, louvers and the like to further modify light after it is emitted from a light engine.

Figure 12:
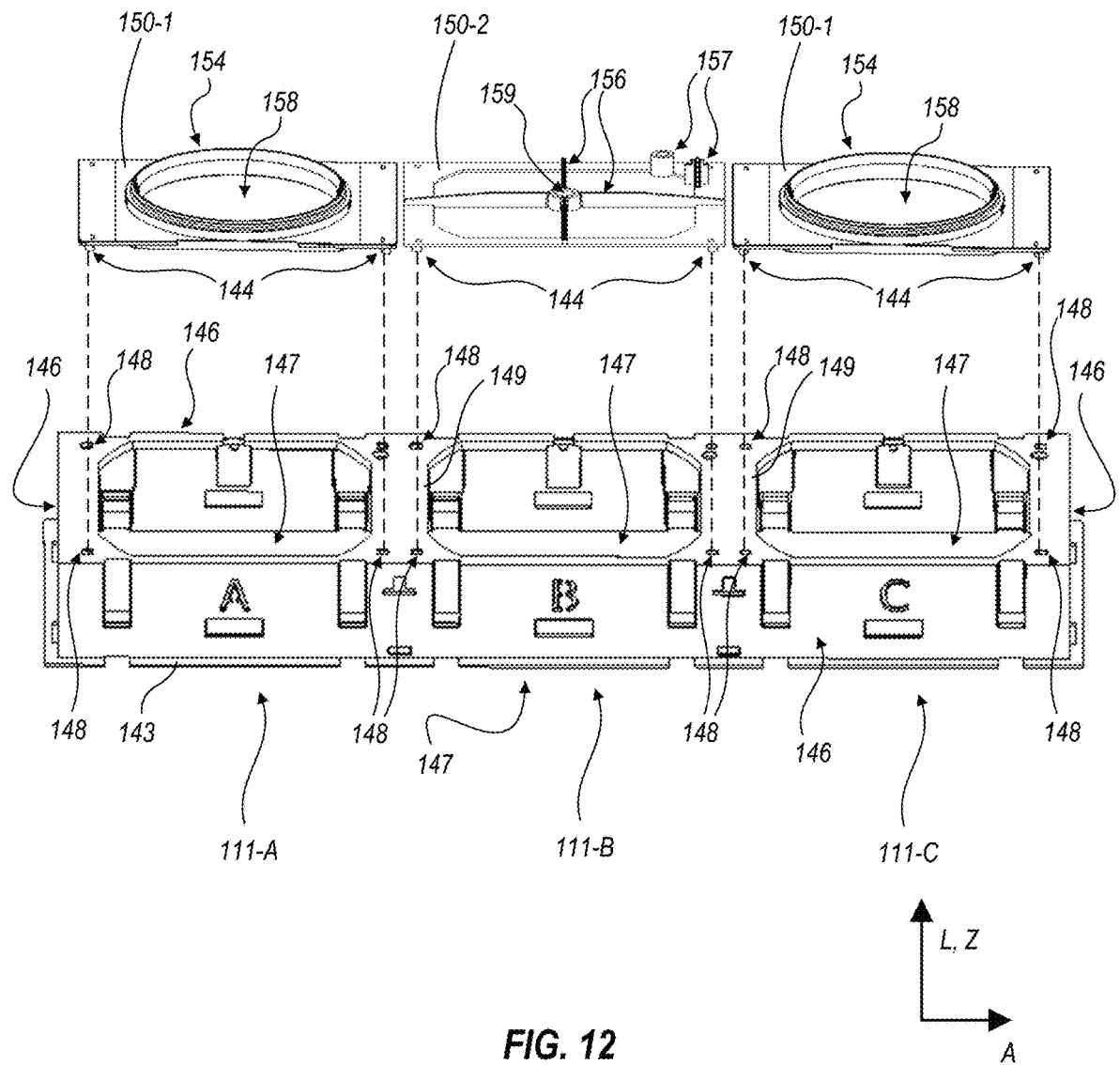
FIG. 12 is a schematic, isometric view illustrating relationships of a manifold housing with a plurality of adapter plates, in accord with an embodiment.

FIG. 12 is a schematic, isometric view illustrating relationships of manifold housing 143 with a plurality of adapter plates 150. Specifically, two adapter plates 150 illustrated in FIG. 9 are adapter plates 150-1 (see FIGS. 3B, 3C, 4A, 4B) and one is adapter plate 150-2 (see FIGS. 8, 9); the adapter plates are arranged about light engine positions 111-A, 111-B and 111-C as they would be in FIG. 8, although adapter plates 150-1 are hidden in the perspective of FIG. 8. Adapter plates 150-1 are configured to mate with light engines 110-1, while adapter plate 150-2 is configured to support center support 311 of pendant 310 (FIGS. 8, 9). FIG. 12 provides axes denoting the vertical (Z), axial (A) and lateral (L) directions as used elsewhere herein; because the view of FIG. 12 is tilted forwardly about the axial axis, the L and Z directions are both vertical in the orientation of the drawing.

Housing 143 includes sidewalls 146 that define a manifold aperture 147, in which baffle 123 can be installed (see, e.g., FIGS. 3A, 3C, 8 and 9) and which continues through each light engine position 111-A, 111-B, 111-C. That is, manifold aperture 147 may be referred to as singular herein although housing 143 includes optional structural crossbars 149 for improved mechanical stability, subdividing manifold aperture 147 at an upper extent of housing 143. In embodiments, structural crossbars 149 are not present such that manifold aperture 147 continues unbroken from light-emitting side 106 to an upper side of housing 143. Thus, similarly to the term "manifold housing," the term "manifold aperture" herein is also not intended to mean only such housings that encompass only one light engine position; furthermore the use of "manifold aperture" in the singular should be taken to refer to all branches or subdivisions of such aperture. Sidewalls 146 extend from one or more upper edges of the manifold aperture to a lower edge of the manifold aperture. Dimensions of manifold aperture 147 define the axial and lateral directions; typically a longer dimension of manifold aperture 147 defines the axial direction while a shorter dimension of manifold aperture 147 defines the lateral direction, although this is not a requirement. Manifold housing 143 forms one or more coupling features 148 that are complementary to one or more corresponding coupling features 144 of adapter plates 150, as shown (some coupling features 144 are hidden in the view of FIG. 12). Coupling features 148 can couple with coupling features 144 in any manner, such as through a snap fit or an interference fit.

In embodiments, adapter plates are complementary to light engines and/or other features mounted on the respective adapter plates, but may be configured with coupling features 144 of a similar type and spacing so as to couple with manifold housing 143, interchangeably with one another. Adapter plate 150-1 includes a ring feature 154 configured to couple with a lower edge of a rotation/tilt housing 370 (see FIGS. 8, 9). Ring feature 154 and rotation/tilt housing 370 are coupled in such a way that rotation of rotation/tilt housing 370 is not constrained, that is, rotation/tilt housing 370 can swivel (e.g., to any azimuthal angle) about ring feature 154. Also, rotation/tilt housing 370 can be adjusted by manipulation from light-emitting side 106 of the light fixture (e.g., the side toward which light engines 110 emit light) without requiring mechanical access above aperture plate 150-1. Adapter plate 150-1 also defines an adapter plate aperture 158 through which a light engine may emit light.

Adapter plate 150-2 includes stiffeners 156 and a center hole 159 to accommodate center support 311 of pendant 310. Adapter plate 150-2 also includes strain relief features 157 such that wiring from a power supply can be anchored or tied off to adapter plate 150-2 and pass without tension into center support 311.

Although some embodiments are illustrated herein as linear fixtures (e.g., with all light engines of a given fixture arranged in a line), they need not be. For example, housings may be configured in other shapes such as arrays, s-shapes or other nonlinear arrangements of light engines. Upon reading and comprehending the present disclosure, one of ordinary skill in the art will readily conceive many equivalents, extensions, and alternatives.

The foregoing is provided for purposes of illustrating, explaining, and describing embodiments of the present invention. Further modifications and adaptations to these embodiments will be apparent to those skilled in the art and may be made without departing from the scope or spirit of the invention. Different arrangements of the components depicted in the drawings or described above, as well as components and steps not shown or described, are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

What is claimed is:

1. A light fixture, comprising:
   a manifold housing having sidewalls that define a manifold aperture, the sidewalls extending from one or more upper edges of the manifold aperture to a lower edge of the manifold aperture, wherein:
      a first dimension of the manifold aperture defines an axial direction and a second dimension of the manifold aperture defines a lateral direction, and the manifold housing comprises one or more first coupling features;
   at least one adapter plate, comprising one or more second coupling features, wherein:
      the at least one adapter plate defines an adapter plate aperture, and
      the one or more second coupling features of the at least one adapter plate removably couple with the one or more first coupling features of the manifold housing to secure the at least one adapter plate atop the manifold housing;
   at least one light engine that emits light, wherein the at least one light engine removably couples atop the at least one adapter plate such that light emitted by the at least one light engine passes first through the adapter plate aperture, and subsequently through the upper and lower edges of the manifold aperture, toward a light-emitting side of the light fixture; and
   a baffle that substantially spans the manifold aperture in the axial and lateral directions, and comprises at least one baffle cell;
   wherein the at least one baffle cell comprises:
      (i) an upper baffle edge that defines an upper baffle aperture through which the light emitted by the at least one light engine passes,
      (ii) a lower baffle edge that defines an output aperture for the emitted light, and
      (iii) a baffle cell wall that extends from the upper baffle edge to the lower baffle edge.

2. The light fixture of claim 1, further comprising:
   a trim piece that removably couples with the manifold housing so as to be positioned proximate the lower edge of the manifold aperture,
   wherein the trim piece is configured to extend outwardly from the manifold housing over an architectural surface.

3. The light fixture of claim 2, wherein the trim piece blocks light at angles higher than about 55 degrees from nadir in the lateral direction.

4. The light fixture of claim 1, wherein:
   the at least one adapter plate consists of a single adapter plate;
   the at least one light engine consists of a single light engine; and
   the baffle consists of a single baffle cell.

5. A light fixture, comprising:
   a manifold housing having sidewalls that define a manifold aperture, the sidewalls extending from one or more upper edges of the manifold aperture to a lower edge of the manifold aperture, wherein:
      a first dimension of the manifold aperture defines an axial direction and a second dimension of the manifold aperture defines a lateral direction, and the manifold housing comprises one or more first coupling features;
   at least one adapter plate, comprising one or more second coupling features, wherein:
      the at least one adapter plate defines an adapter plate aperture,
      the one or more second coupling features of the at least one adapter plate removably couple with the one or more first coupling features of the manifold housing to secure the at least one adapter plate to the manifold housing,
      the at least one adapter plate comprises a first adapter plate and a second adapter plate, and
      the first adapter plate and the second aperture plate couple with the manifold housing at respective light emitter positions;
   at least a first light engine that emits light and a second light engine that emits light, wherein the first light engine removably couples with the first adapter plate and the second light engine removably couples with the second adapter plate, such that light emitted by the first light engine passes through the first adapter plate aperture and the manifold aperture, and light emitted by the second light engine passes through the second adapter plate aperture and the manifold aperture, toward a light-emitting side of the light fixture; and
   a baffle that substantially spans the manifold aperture, and comprises a first baffle cell and a second baffle cell, wherein each of the first baffle cell and the second baffle cell comprises:
      (i) a upper baffle edge that defines an upper baffle aperture through which the light emitted by the respective first or second light engine passes,
      (ii) a lower baffle edge that defines an output aperture for the emitted light, and
      (iii) a baffle cell wall that extends from the upper baffle edge to the lower baffle edge;
   and wherein a portion of the light emitted by the first light engine is reflected by the baffle cell wall of the first baffle cell and a portion of the light emitted by the second light engine is reflected by the baffle cell wall of the second baffle cell.

6. The light fixture of claim 5, wherein the lower edges of the first baffle cell and the second baffle cell meet, forming a divider that extends in the lateral direction between the first and second baffle cells.

7. The light fixture of claim 6, wherein the divider blocks light emitted by the first and second light engines at angles higher than about 55 degrees from nadir in the axial direction.

8. A light fixture, comprising:
- a manifold housing having sidewalls that define a manifold aperture, the sidewalls extending from one or more upper edges of the manifold aperture to a lower edge of the manifold aperture, wherein:
  - a first dimension of the manifold aperture defines an axial direction and a second dimension of the manifold aperture defines a lateral direction, and
  - the manifold housing comprises one or more first coupling features;
- at least one adapter plate, comprising one or more second coupling features, wherein:
  - the at least one adapter plate defines an adapter plate aperture, and
  - the one or more second coupling features of the at least one adapter plate removably couple with the one or more first coupling features of the manifold housing to secure the at least one adapter plate to the manifold housing;
- at least one light engine that emits light, wherein the at least one light engine removably couples with the at least one adapter plate such that light emitted by the at least one light engine passes through the adapter plate aperture and the manifold aperture toward a light-emitting side of the light fixture; and wherein the at least one light engine comprises:
  - a light source housing that defines an optical axis,
  - a light source, coupled with the light source housing, that emits the light along the optical axis, and
  - a rotation/tilt housing that couples with the at least one adapter plate, and supports the light source housing such that directionality of the light emitted along the optical axis can be adjusted relative to the manifold housing; and
- a baffle that substantially spans the manifold aperture and comprises at least one baffle cell, wherein the at least one baffle cell comprises:
  - (i) an upper baffle edge that defines an upper baffle aperture through which the light emitted by the at least one light engine passes,
  - (ii) a lower baffle edge that defines an output aperture for the emitted light, and
  - (iii) a baffle cell wall that extends from the upper baffle edge to the lower baffle edge.

9. The light fixture of claim 8, wherein the rotation/tilt housing is configured to adjust at least one of tilt or rotation of the light emitted by the at least one light engine.

10. The light fixture of claim 8, wherein the rotation/tilt housing is configured such that directionality of the light emitted from the at least one light engine can be adjusted by manipulation from the light-emitting side of the light fixture, without requiring mechanical access above the adapter plate.

11. A light fixture, comprising:
- a manifold housing having sidewalls that define a manifold aperture, the sidewalls extending from one or more upper edges of the manifold aperture to a lower edge of the manifold aperture, wherein:
  - a first dimension of the manifold aperture defines an axial direction and a second dimension of the manifold aperture defines a lateral direction, and
  - the manifold housing comprises one or more first coupling features;
- at least one adapter plate, comprising one or more second coupling features, wherein:
  - the at least one adapter plate defines an adapter plate aperture, and
  - the one or more second coupling features of the at least one adapter plate removably couple with the one or more first coupling features of the manifold housing to secure the at least one adapter plate to the manifold housing;
- at least one light engine that emits light, wherein the at least one light engine removably couples with the at least one adapter plate such that light emitted by the at least one light engine passes through the adapter plate aperture and the manifold aperture toward a light-emitting side of the light fixture; and wherein the at least one light engine comprises:
  - a light source housing;
  - a light source coupled with the light source housing;
  - a primary optic at least partially positioned within the light source housing; and
  - a retainer ring coupled with the light source housing, wherein:
    - the retainer ring couples the primary optic with the light source housing, and
    - the retainer ring comprises:
      - a retainer ring body;
      - coupling features that engage the light source housing; and
      - a secondary optic, formed integrally with the retainer ring body, that extends away from the light source housing;
- the light fixture further comprising a baffle that substantially spans the manifold aperture and comprises at least one baffle cell;
- wherein the at least one baffle cell comprises:
  - (i) an upper baffle edge that defines an upper baffle aperture through which the light emitted by the at least one light engine passes,
  - (ii) a lower baffle edge that defines an output aperture for the emitted light, and
  - (iii) a baffle cell wall that extends from the upper baffle edge to the lower baffle edge.

12. The light fixture of claim 11, wherein the secondary optic comprises a reflector configured to reflect at least a portion of the light from the at least one light engine.

13. The light fixture of claim 12, wherein the reflector is a wall wash kicker reflector, and the retainer ring body is rotatable, relative to the light source housing, to adjust a direction in which light from the at least one light engine is reflected.

14. The light fixture of claim 12, wherein the retainer ring body, the coupling features and the reflector comprise an integrally molded plastic component.

15. The light fixture of claim 14, wherein the reflector further comprises a metalized surface of the integrally molded plastic component.

16. A light fixture, comprising:
- a manifold housing having sidewalls that define a manifold aperture, the sidewalls extending from one or more upper edges of the manifold aperture to a lower edge of the manifold aperture, wherein:

a first dimension of the manifold aperture defines an axial direction and a second dimension of the manifold aperture defines a lateral direction, and the manifold housing comprises one or more first coupling features;

at least one adapter plate, comprising one or more second coupling features, wherein:

the at least one adapter plate defines an adapter plate aperture, and the one or more second coupling features of the at least one adapter plate removably couple with the one or more first coupling features of the manifold housing to secure the at least one adapter plate to the manifold housing;

at least one light engine that emits light, wherein the at least one light engine removably couples with the at least one adapter plate such that light emitted by the at least one light engine passes through the adapter plate aperture and the manifold aperture toward a light-emitting side of the light fixture; and a baffle that substantially spans the manifold aperture and comprises at least one baffle cell;

wherein the at least one baffle cell comprises:

(i) an upper baffle edge that defines an upper baffle aperture through which the light emitted by the at least one light engine passes, (ii) a lower baffle edge that defines an output aperture for the emitted light, and (iii) a baffle cell wall that extends from the upper baffle edge to the lower baffle edge;

and wherein:

a plan view shape of the upper baffle edge forms a closed shape that is devoid of angles;

a plan view shape of the lower baffle edge forms a closed shape that is devoid of angles; and the baffle cell wall comprises an inner surface that is continuously, downwardly concave from the upper baffle edge to the lower baffle edge, and is devoid of angles.

17. The light fixture of claim 16, wherein the baffle has a compound azimuthal and vertical profile.

18. A light fixture, comprising:

a manifold housing that comprises one or more first coupling features, the manifold housing defining at least one manifold aperture therethrough;

a plurality of adapter plates, wherein one or more second coupling features of each of the adapter plates removably couple with corresponding ones of the first coupling features, to secure each of the adapter plates to the manifold housing;

a plurality of light engines corresponding in number to the adapter plates, wherein:

each light engine is removably coupled to a corresponding one of the adapter plates, each of the light engines includes a light source within a light source housing, and each of the light sources emits light toward a primary optic that is secured to the light source housing with a retainer ring;

a baffle that substantially spans the manifold aperture and forms one baffle cell for each of the plurality of light engines, each of the baffle cells comprising a baffle cell wall, wherein each baffle cell wall:

defines an upper baffle aperture through which light is received from the primary optic, defines an output aperture through which light is emitted, and forms a compound azimuthal and vertical profile between the upper baffle aperture and the output aperture; and a power supply that includes a plurality of power supply modules, wherein each one of the light engines receives electrical power from a corresponding one of the power supply modules.

* * * * *